(12) United States Patent
Park et al.

(10) Patent No.: US 12,635,196 B2
(45) Date of Patent: May 19, 2026

(54) SEMICONDUCTOR DEVICE

(71) Applicant: Samsung Electronics Co., Ltd.,
Suwon-si (KR)

(72) Inventors: Junmo Park, Suwon-si (KR);
Wookhyun Kwon, Suwon-si (KR);
Yeonho Park, Suwon-si (KR);
Jongmin Shin, Suwon-si (KR);
Heonjong Shin, Suwon-si (KR);
Jongmin Jun, Suwon-si (KR);
Kyubong Choi, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 393 days.

(21) Appl. No.: 18/323,715

(22) Filed: May 25, 2023

(65) Prior Publication Data

US 2024/0136398 A1 Apr. 25, 2024
US 2024/0234502 A9 Jul. 11, 2024

(30) Foreign Application Priority Data

Oct. 25, 2022 (KR) ........................ 10-2022-0138567
Oct. 27, 2022 (KR) ........................ 10-2022-0140469

(51) Int. Cl.
H10D 62/10 (2025.01)
H10D 30/43 (2025.01)
(Continued)

(52) U.S. Cl.
CPC ........... H10D 62/121 (2025.01); H10D 30/43
(2025.01); H10D 30/6735 (2025.01);
(Continued)

(58) Field of Classification Search
CPC ............. H10D 30/024; H10D 30/6217; H10D
30/019–0191; H10D 30/501–504;
(Continued)

(56) References Cited

U.S. PATENT DOCUMENTS 10,103,238 B1 10/2018 Zang et al.
10,361,269 B2 7/2019 Yeung et al.
(Continued)

FOREIGN PATENT DOCUMENTS

| CN | 114078702 A | 2/2022 |
| EP | 4254504 A2 | 10/2023 |
| KR | 2020/0029264 A | 3/2020 |

*Primary Examiner* — Julio J Maldonado
*Assistant Examiner* — Eric Manuel Mulero Flores
(74) *Attorney, Agent, or Firm* — HARNESS, DICKEY &
PIERCE, P.L.C.

(57) ABSTRACT

A semiconductor device may include a substrate including
an active pattern, a channel pattern on the active pattern, a
source/drain pattern, a gate electrode, and an insulation
pattern. The channel pattern may include semiconductor
patterns that are spaced apart from each other and vertically
stacked. A lowermost one of the semiconductor patterns may
be a first semiconductor pattern. The source/drain pattern
may be connected to the semiconductor patterns. The gate
electrode may be on the semiconductor patterns and may
include a plurality of inner electrodes below the semicon-
ductor patterns except the first semiconductor pattern. The
insulation pattern may be between the first semiconductor
pattern and the active pattern. The insulation pattern may
include a dielectric pattern and a protection layer. The
protection layer may be between the dielectric pattern and
the first semiconductor pattern. The protection layer may be
between the dielectric pattern and the active pattern.

20 Claims, 44 Drawing Sheets

(51) Int. Cl.
    *H10D 30/67*        (2025.01)
    *H10D 62/80*        (2025.01)
    *H10D 64/27*        (2025.01)

(52) U.S. Cl.
    CPC ......... *H10D 30/6757* (2025.01); *H10D 62/80*
             (2025.01); *H10D 64/514* (2025.01)

(58) Field of Classification Search
    CPC ........... H10D 62/118–119; H10D 62/113–116;
             H10D 62/121; H10D 64/68–683; H10D
                      30/6735; H10D 30/6757
    See application file for complete search history.

(56)              References Cited

U.S. PATENT DOCUMENTS

| | | | |
|---|---|---|---|
| 10,418,487 B2 | 9/2019 | Rachmady et al. | |
| 10,741,641 B2 | 8/2020 | Guillorn et al. | |
| 10,930,649 B2 | 2/2021 | Kang et al. | |
| 11,062,937 B2 | 7/2021 | Cheng et al. | |
| 11,195,911 B2 | 12/2021 | Xie et al. | |
| 11,222,979 B2 | 1/2022 | Miao et al. | |
| 11,309,424 B2 | 4/2022 | Lin et al. | |
| 2020/0365467 A1 | 11/2020 | Cheng et al. | |
| 2020/0365687 A1* | 11/2020 | Xie .................... | H01L 21/3065 |
| 2021/0134795 A1 | 5/2021 | Ju et al. | |
| 2021/0135011 A1 | 5/2021 | Ju et al. | |
| 2021/0183855 A1 | 6/2021 | Ng et al. | |
| 2022/0029028 A1 | 1/2022 | Chung et al. | |
| 2022/0059668 A1 | 2/2022 | Mokhtarzadeh et al. | |
| 2022/0149169 A1 | 5/2022 | Young et al. | |
| 2022/0181259 A1* | 6/2022 | Chiang .................. | H10D 84/85 |

\* cited by examiner

SEMICONDUCTOR DEVICE

CROSS-REFERENCE TO RELATED APPLICATIONS

This U.S. nonprovisional application claims priority under 35 U.S.C § 119 to Korean Patent Applications No. 10-2022-0138567 filed on Oct. 25, 2022 and No. 10-2022-0140469 filed on Oct. 27, 2022 in the Korean Intellectual Property Office, the disclosures of which are hereby incorporated by reference in their entirety.

BACKGROUND

Inventive concepts relate to a semiconductor device, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some embodiments of inventive concepts provide a semiconductor device with increased reliability and improved electrical properties.

Some embodiments of inventive concepts provide a method of fabricating a semiconductor device with increased reliability and improved electrical properties.

According to some embodiments of inventive concepts, a semiconductor device may include a substrate including an active pattern; a channel pattern on the active pattern, the channel pattern including a plurality of semiconductor patterns that are spaced apart from each other and vertically stacked, and a lowermost one of the plurality of semiconductor patterns being a first semiconductor pattern; a source/drain pattern connected to the plurality of semiconductor patterns; a gate electrode on the plurality of semiconductor patterns; and an insulation pattern between the first semiconductor pattern and the active pattern. The gate electrode may include a plurality of inner electrodes below the plurality of semiconductor patterns except the first semiconductor pattern. The insulation pattern may include a dielectric pattern and a protection layer. The protection layer may be between the dielectric pattern and the first semiconductor pattern. The protection layer may be between the dielectric pattern and the active pattern.

According to some embodiments of inventive concepts, a semiconductor device may include a substrate including an active region; a device isolation layer on the active region, the device isolation layer defining an active pattern on the active region; a channel pattern on the active pattern, the channel pattern including a plurality of semiconductor patterns that are spaced apart from each other and vertically stacked, a lowermost one of the plurality of semiconductor patterns being a first semiconductor pattern; a source/drain pattern connected to the plurality of semiconductor patterns; a gate electrode on the plurality of semiconductor patterns; and an insulation pattern between the first semiconductor pattern and the active pattern. The gate electrode may include a plurality of inner electrodes below the plurality of semiconductor patterns except the first semiconductor pattern. The insulation pattern may extend onto the device isolation layer between the first semiconductor pattern and the active pattern.

According to some embodiments of inventive concepts, a semiconductor device may include a substrate that includes an active pattern; a channel pattern on the active pattern, the channel pattern including a plurality of semiconductor patterns that are spaced apart from each other and vertically stacked, a lowermost one of the plurality of semiconductor patterns being a first semiconductor pattern; a source/drain pattern connected to the plurality of semiconductor patterns; a gate electrode on the plurality of semiconductor patterns; and an insulation pattern between the first semiconductor pattern and the active pattern. The gate electrode may include a plurality of inner electrodes below the plurality of semiconductor patterns except the first semiconductor pattern. The insulation pattern may include a dielectric pattern and a protection layer. The protection layer may be between the dielectric pattern and the first semiconductor pattern. The protection layer may be between the dielectric pattern and the active pattern. The gate electrode may extend in a first direction. The protection layer may have a first width in the first direction. The dielectric pattern may have a second width in the first direction. The first width may be different from the second width.

DETAILED DESCRIPTION OF EMBODIMENTS

Figure 1:
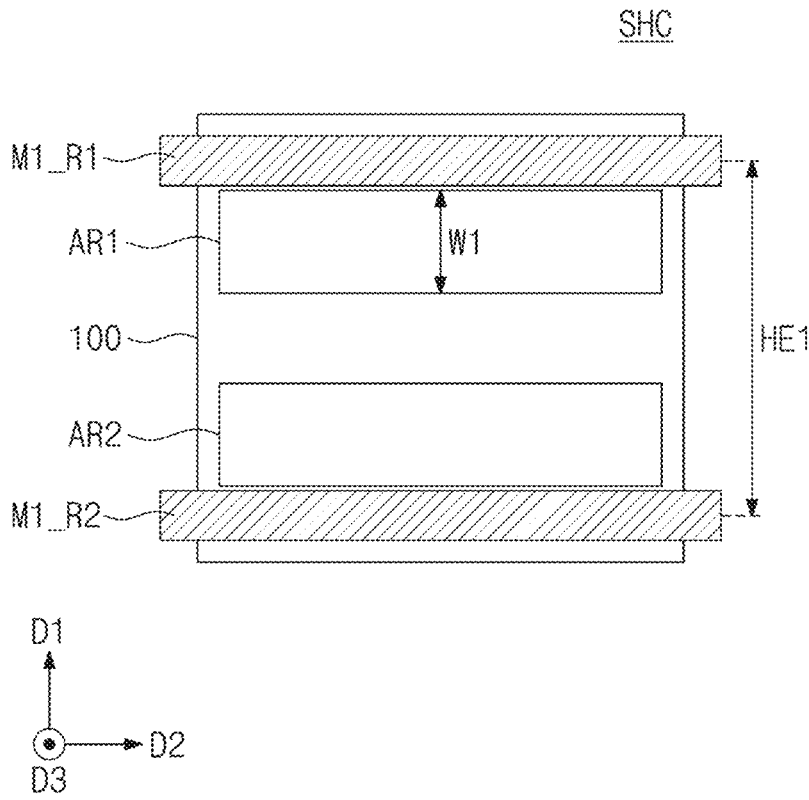
FIGS. 1 to 3 illustrate conceptual views showing logic cells of a semiconductor device according to some embodiments of inventive concepts.
Figure 2:
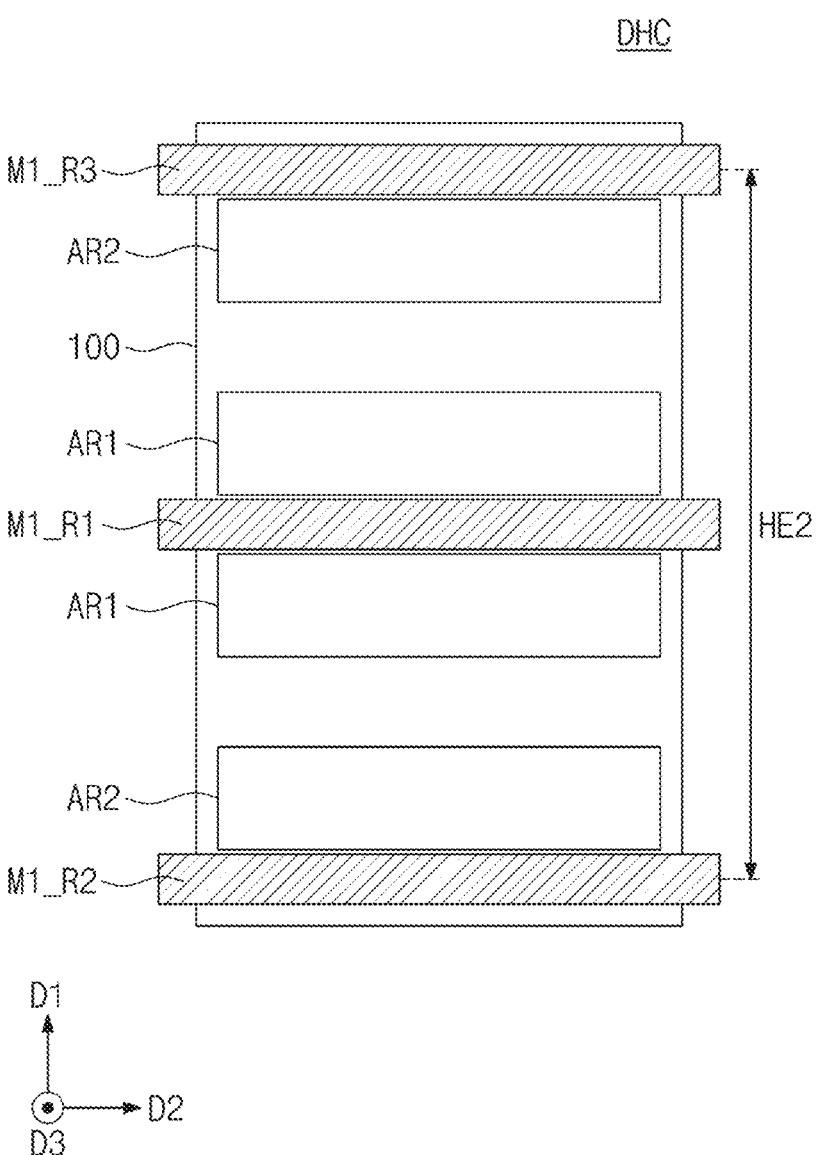
Figure 3:
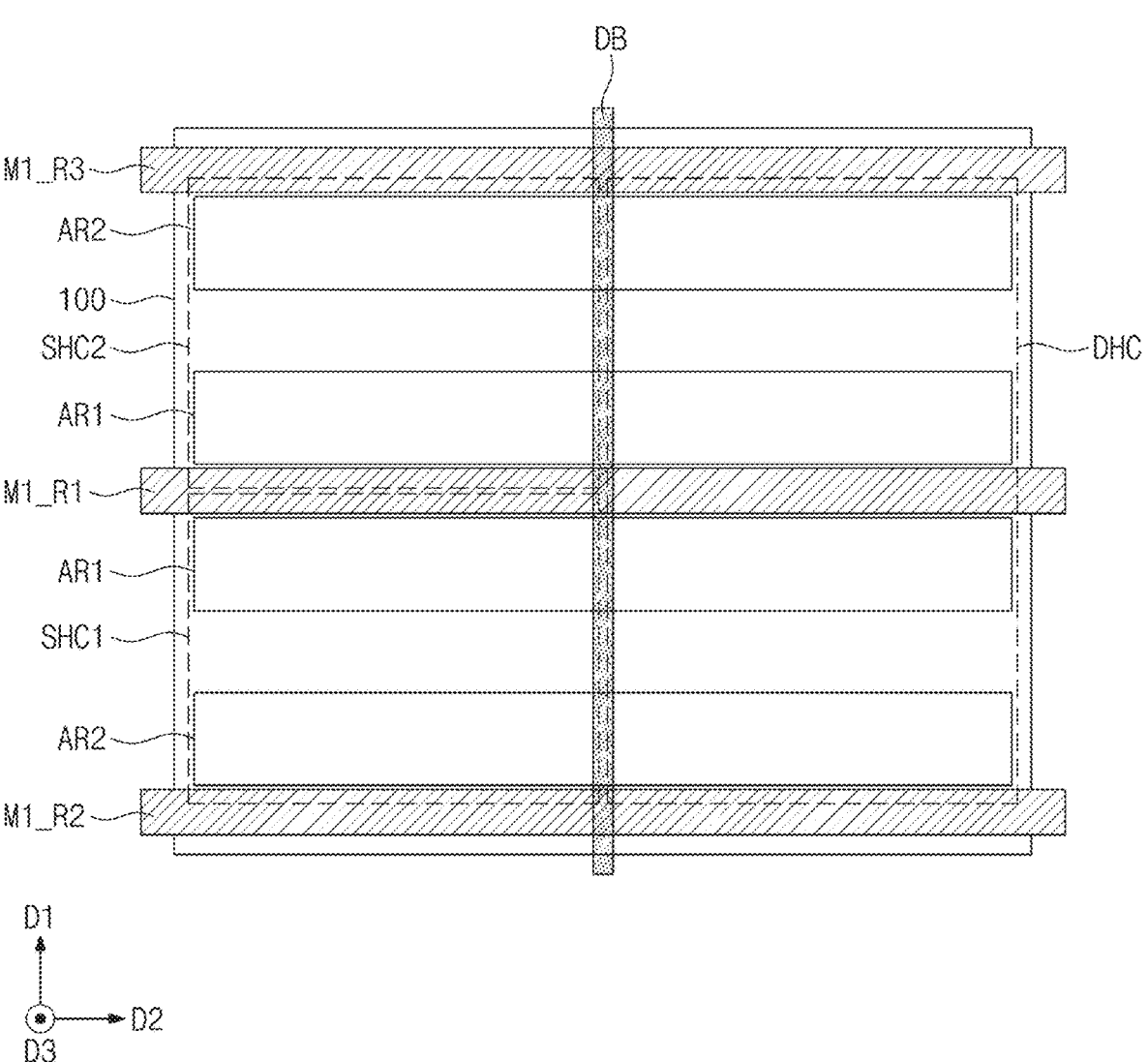

FIGS. 1 to 3 illustrate conceptual views showing logic cells of a semiconductor device according to some embodiments of inventive concepts.

Referring to FIG. 1, a single height cell SHC may be provided. For example, a substrate 100 may be provided thereon with a first power line M1_R1 and a second power line M1_R2. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2.

The single height cell SHC may include one first active region AR1 and one second active region AR2. One of the first and second active regions AR1 and AR2 may be a PMOSFET region, and the other of the first and second active regions AR1 and AR2 may be an NMOSFET region. For example, the single height cell SHC may have a complementary metal oxide semiconductor (CMOS) structure provided between the first power line M1_R1 and the second power line M1_R2.

Each of the first and second active regions AR1 and AR2 may have a first width W1 in a first direction D1. A first height HE1 may be defined to indicate a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a source voltage VSS.

The double height cell DHC may be defined between the second power line M1_R2 and the third power line M1_R3. The double height cell DHC may include two first active regions AR1 and two second active regions AR2.

One of the two second active regions AR2 may be adjacent to the second power line M1_R2. The other of the two second active regions AR2 may be adjacent to the third power line M1_R3. The two first active regions AR1 may be adjacent to the first power line M1_R1. When viewed in plan, the first power line M1_R1 may be disposed between the two first active regions AR1.

A second height HE2 may be defined to indicate a length in the first direction D1 of the double height cell DHC. The second height HE2 may be about twice the first height HE1 of FIG. 1. The two first active regions AR1 of the double height cell DHC may be collectively connected together to act as one active region.

In embodiments of inventive concepts, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be located between a first power line M1_R1 and a second power line M1_R2. The second single height cell SHC2 may be located between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3.

The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
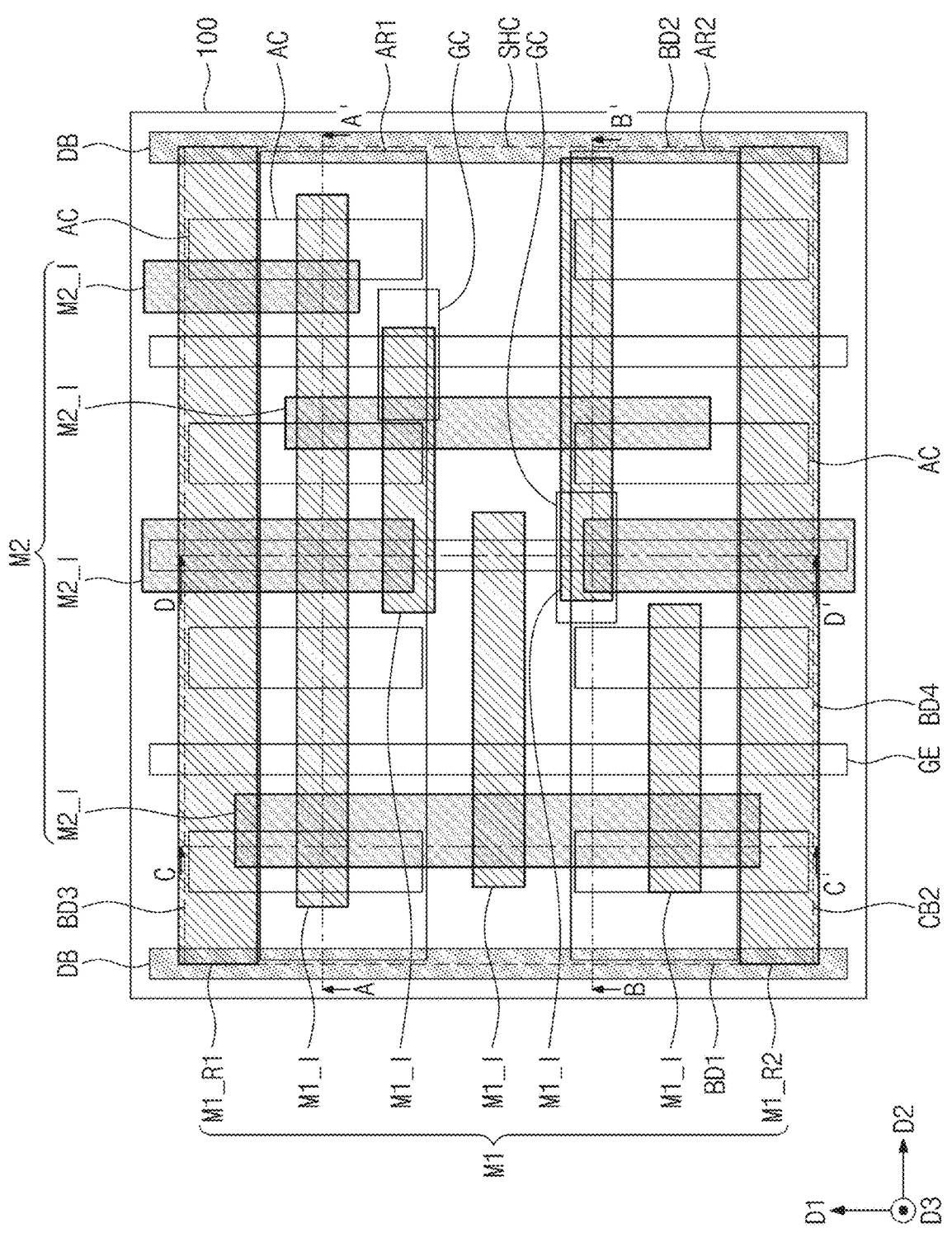
FIG. 4 illustrates a plan view showing a semiconductor device according to some embodiments of inventive concepts.
Figure 5A:
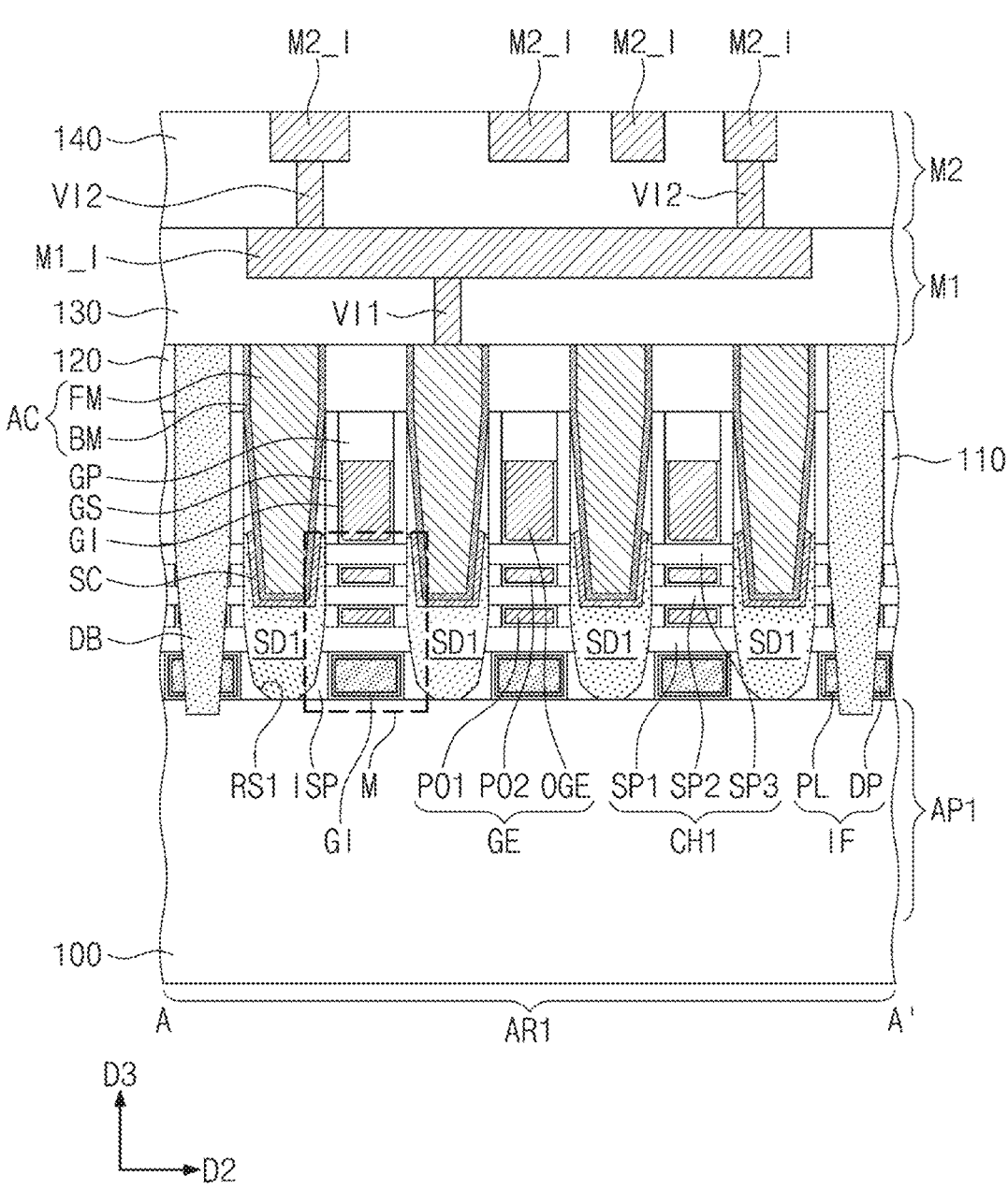
FIGS. 5A, 5B, 5C, and 5D illustrate cross-sectional views respectively taken along lines A-A', B-B', C-C', and D-D' of FIG. 4.
Figure 5B:
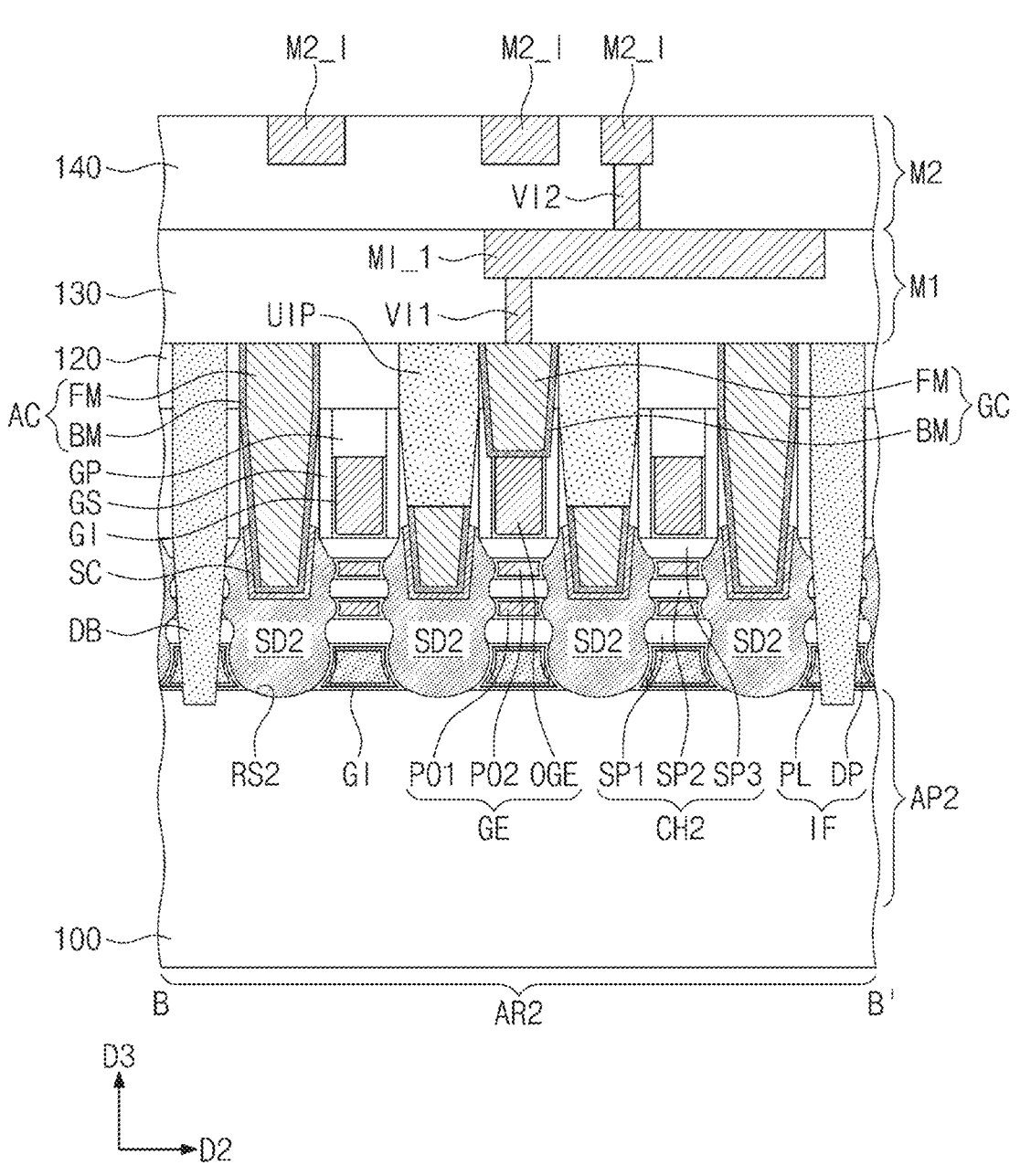
Figure 5C:
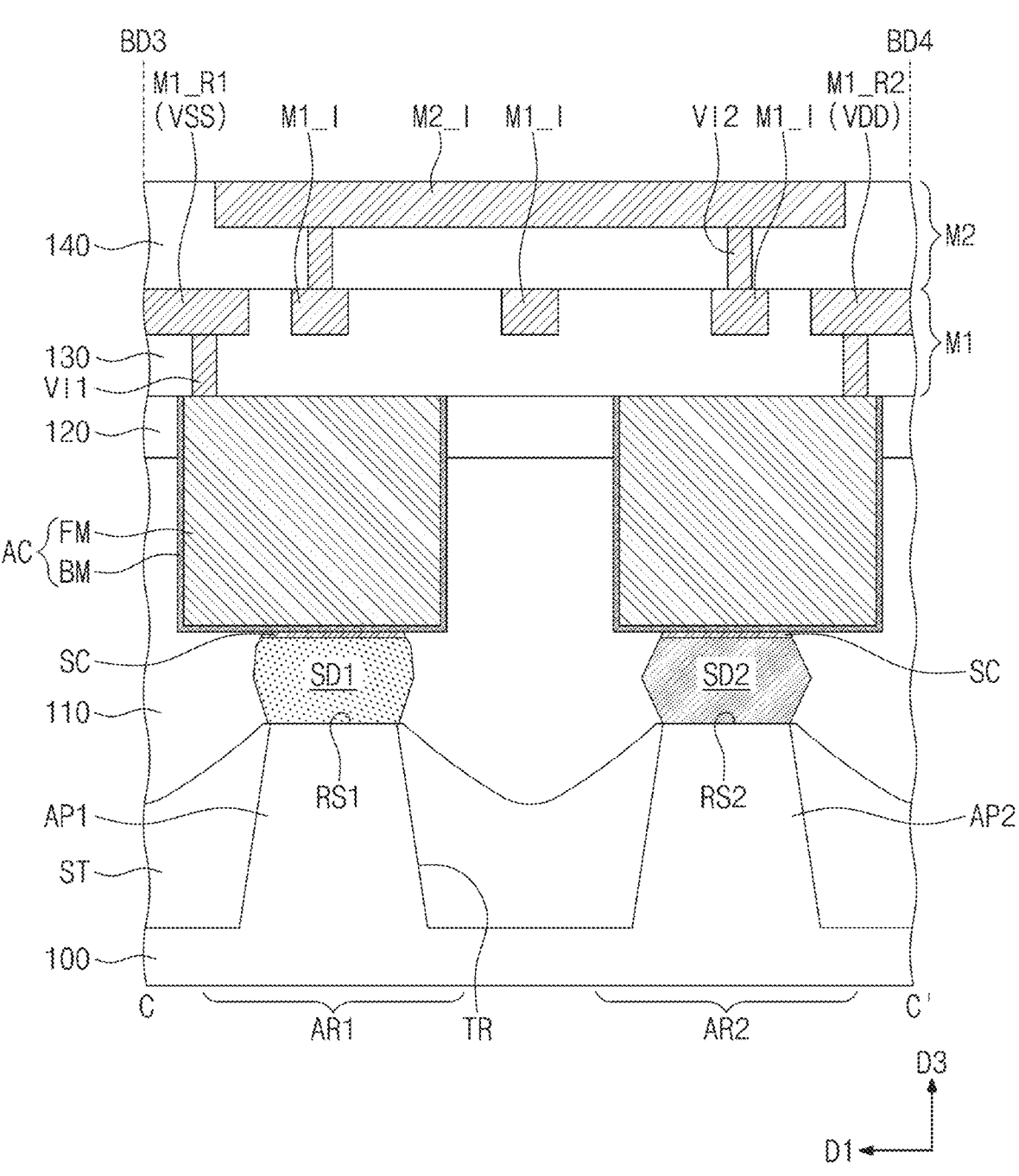

FIG. 4 illustrates a plan view showing a semiconductor device according to some embodiments of inventive concepts. FIGS. 5A, 5B, 5C, and 5D illustrate cross-sectional views respectively taken along lines A-A', B-B', C-C', and D-D' of FIG. 4. FIG. 6 illustrates an enlarged view showing an example of section M depicted in FIG. 5A. A semiconductor device depicted in FIGS. 4 and 5A to 5D is a detailed example of the single height cell SHC shown in FIG. 1.

Referring to FIGS. 4 and 5A to 5D, a single height cell SHC may be provided on a substrate 100. The single height cell SHC may be provided thereon with logic transistors included in a logic circuit. The substrate 100 may be a compound semiconductor substrate or a semiconductor substrate including silicon, germanium, or silicon-germanium. For example, the substrate 100 may be a silicon substrate.

The substrate 100 may include a first active region AR1 and a second active region AR2. Each of the first and second active regions AR1 and AR2 may extend in a second direction D2. In an embodiment, the first active region AR1 may be an NMOSFET region, and the second active region AR2 may be a PMOSFET region.

A first active pattern AP1 and a second active pattern AP2 may be defined by a trench TR formed on an upper portion of the substrate 100. The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be vertically protruding portions of the substrate 100.

A device isolation layer ST may be provided on the substrate 100. The device isolation layer ST may fill the trench TR. The device isolation layer ST may include a silicon oxide layer. The device isolation layer ST may not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (or a third direction D3).

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon. In an embodiment of inventive concepts, the first, second, and third semiconductor patterns SP1, SP2, and SP3 may be stacked nano-sheets.

A plurality of first source/drain patterns SD1 may be provided on the first active pattern AP1. A plurality of first recesses RS1 may be formed on an upper portion of the first active pattern AP1. First source/drain patterns SD1 may be correspondingly provided in the first recesses RS1. The first source/drain patterns SD1 may be impurity regions of a first conductivity type (e.g., n-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recesses RS2 may be formed on an upper portion of the second active pattern AP2. Second source/drain patterns SD2 may be correspondingly provided in the second recesses RS2. The second source/drain patterns SD2 may be impurity regions of a second conductivity type (e.g., p-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth (SEG) process. For example, each of the first and second source/drain patterns SD1 and SD2 may have a top surface higher than that of the third semiconductor pattern SP3. For another example, at least one of the first and second source/drain patterns SD1 and SD2 may have a top surface at substantially the same level as that of a top surface of the third semiconductor pattern SP3.

In an embodiment of inventive concepts, the first source/drain patterns SD1 may include the same semiconductor element (e.g., Si) as that of the substrate 100. The second source/drain patterns SD2 may include a semiconductor element (e.g., SiGe) whose lattice constant is greater than that of a semiconductor element of the substrate 100. Therefore, a pair of second source/drain patterns SD2 may provide the second channel pattern CH2 with compressive stress.

In an embodiment of inventive concepts, the second source/drain pattern SD2 may have an uneven embossing shape on a sidewall thereof. For example, the sidewall of the second source/drain pattern SD2 may have a wave-shape profile. The sidewall of the second source/drain pattern SD2 may protrude toward an insulation pattern IF and first and second inner electrodes PO1 and PO2 of a gate electrode GE which will be discussed below.

The first and second channel patterns CH1 and CH2 may be provided thereon with gate electrodes GE. Etch of the gate electrodes GE may extend in a first direction D1, while running across the first and second channel patterns CH1 and CH2. Each of the gate electrodes GE may vertically overlap the first and second channel patterns CH1 and CH2. The gate electrodes GE may be arranged at a first pitch in the second direction D2.

The gate electrode GE may include a first inner electrode PO1 interposed between the first semiconductor pattern SP1 and the second semiconductor pattern SP2, a second inner electrode PO2 interposed between the second semiconductor pattern SP2 and the third semiconductor pattern SP3, and an outer electrode OGE on the third semiconductor pattern SP3.

Figure 5D:
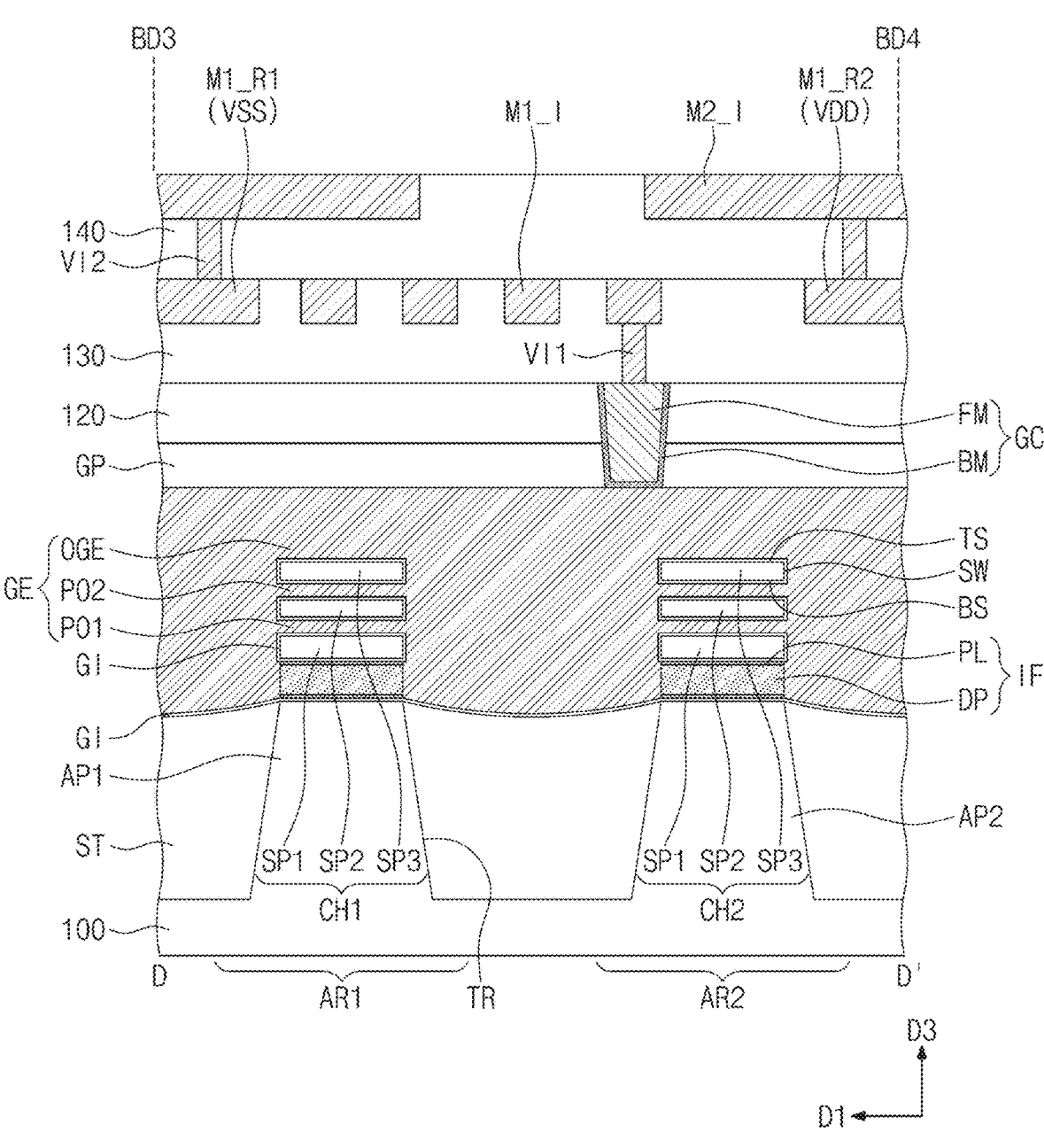
Figure 6:
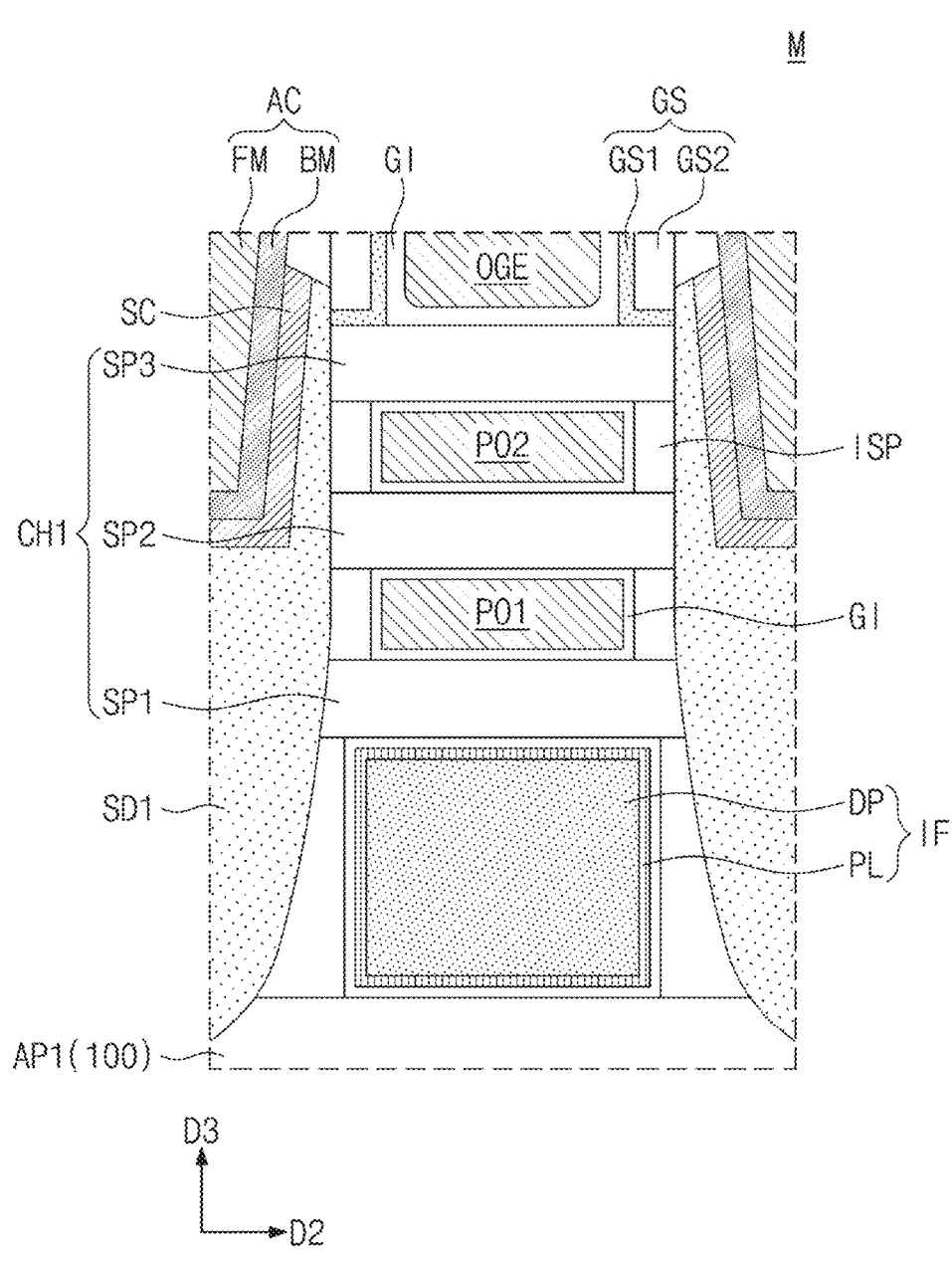
FIG. 6 illustrates an enlarged view showing an example of section M depicted in FIG. 5A.

Referring to FIG. 5D, the gate electrode GE may be provided on a top surface TS, a bottom surface BS, and opposite sidewalls SW of each of the second and third semiconductor patterns SP2 and SP3. The gate electrode GE may be provided on a top surface TS and opposite sidewalls SW of the first semiconductor pattern SP1. For example, a transistor according to the present embodiment may be a three-dimensional field effect transistor (e.g., MBCFET or GAAFET) in which the gate electrode GE three-dimensionally surrounds the first and second channel patterns CH1 and CH2.

Referring back to FIG. 5A, on the first active region AR1, inner spacers ISP may be interposed between the first source/drain pattern SD1 and the first and second inner electrodes PO1 and PO2 of the gate electrode GE and between the first source/drain pattern SD1 and the insulation pattern IF. The first and second inner electrodes PO1 and PO2 and the insulation pattern IF may each be spaced apart from the first source/drain pattern SD1 across the inner spacer ISP. The inner spacers ISP may limit and/or prevent leakage current from the gate electrode GE.

Referring again to FIGS. 4 and 5A to 5D, a pair of gate spacers GS may be disposed on opposite sidewalls of the outer electrode OGE included in the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. In an embodiment, the gate spacers GS may include at least one selected from SiCN, SiCON, and SiN. In another embodiment, the gate spacers GS may include a multiple layer formed of at least two selected from SiCN, SiCON, and SiN.

In an embodiment of inventive concepts, referring to FIG. 6, the gate spacer GS may include a first spacer GS1 on a sidewall of the gate electrode GE and a second spacer GS2 on the first spacer GS1. Each of the first and second spacers GS1 and GS2 may include a silicon-containing dielectric material. For example, the first spacer GS1 may include a silicon-containing low-k dielectric material, for example, SiCON. The second spacer GS2 may include a silicon-containing dielectric material with excellent resistance to etching, such SiN. The second spacer GS2 may serve as an etch stop layer when active contacts AC are formed as discussed below. The second spacer GS2 may be used to form the active contacts AC in a self-alignment manner.

Referring back to FIGS. 4 and 5A to 5D, a gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first to third semiconductor patterns SP1 to SP3 (see FIG. 5D). The gate dielectric layer GI may cover a top surface of the device isolation layer ST that underlies the gate electrode GE.

In an embodiment of inventive concepts, the gate dielectric layer GI may include one or more of a silicon oxide layer, a silicon oxynitride layer, and a high-k dielectric layer. For example, the gate dielectric layer GI may have a structure in which a silicon oxide layer and a high-k dielectric layer are stacked. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Alternatively, a semiconductor device according to inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, one or more of hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, one or more of hafnium oxide, zirconium oxide, and aluminum oxide, but inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but inventive concepts are not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

Referring once more to FIGS. 4 and 5A to 5D, the gate electrode GE may include a first metal pattern and a second metal pattern on the first metal pattern. The first metal pattern may be provided on the gate dielectric layer GI and may be adjacent to the second and third semiconductor patterns SP2 and SP3. The first metal pattern may include a work-function metal that controls a threshold voltage of a transistor. A thickness and composition of the first metal pattern may be adjusted to achieve a desired threshold voltage of a transistor. For example, the first and second inner electrodes PO1 and PO2 of the gate electrode GE may be formed of the first metal pattern or a work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta). For example, the outer electrode OGE of the gate electrode GE may include the first metal pattern and further include the second metal pattern on the first metal pattern.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

The single height cell SHC may have a first boundary BD1 and a second boundary BD2 that are opposite to each other in the second direction D2. The first and second boundaries BD1 and BD2 may extend in the first direction D1. The single height cell SHC may have a third boundary BD3 and a fourth boundary BD4 that are opposite to each other in the first direction D1. The third and fourth boundaries BD3 and BD4 may extend in the second direction D2.

The single height cell SHC may be provided on its opposite sides with a pair of separation structures DB that are opposite to each other in the second direction D2. For example, the pair of separation structures DB may be correspondingly provided on first and second boundaries BD1 and BD2 of the single height cell SHC. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120, and may extend into the first and second active patterns AP1 and AP2. The separation structure DB may penetrate an upper portion of each of the first and second active patterns AP1 and AP2. The separation structure DB may electrically separate an active region of the single height cell SHC from an active region of an adjacent another cell.

Active contacts AC may be provided to penetrate the first and second interlayer dielectric layers 110 and 120 to come into electrical connection with the first and second source/drain patterns SD1 and SD2. A pair of active contacts AC may be correspondingly provided on opposite sides of the gate electrode GE. When viewed in plan, the active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A metal-semiconductor compound layer SC, or a silicide layer, may be interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may include at least one selected from titanium silicide, tantalum silicide, tungsten silicide, nickel silicide, and cobalt silicide.

Gate contacts GC may be provided to penetrate the second interlayer dielectric layer 120 and the gate capping pattern GP to come into electrical connection with the gate electrodes GE. When viewed in plan, the gate contacts GC may be disposed to correspondingly overlap the first active region AR1 and the second active region AR2. For example, the gate contact GC may be provided on the second active pattern AP2 (see FIG. 5B).

In an embodiment of inventive concepts, referring to FIG. 5B, the active contact AC may have an upper portion adjacent to the gate contact GC, and an upper dielectric pattern UIP may fill the upper portion of the active contact AC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to limit and/or prevent an electrical short-circuit resulting from contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. For example, the first metal layer M1 may include a first power line M1_R1, a second power line M1_R2, and first wiring lines M1_I. The lines M1_R1, M1_R2, and M1_I of the first metal layer M1 may extend in parallel to each other in the second direction D2.

For example, the first and second power lines M1_R1 and M1_R2 may be respectively provided on the third and fourth boundaries BD3 and BD4 of the single height cell SHC. The first power line M1_R1 may extend in the second direction D2 along the third boundary BD3. The second power line M1_R2 may extend in the second direction D2 along the fourth boundary BD4.

The first wiring lines M1_I of the first metal layer M1 may be disposed between the first and second power lines M1_R1 and M1_R2. The first wiring lines M1_I of the first metal layer M1 may be arranged at a second pitch along the first direction D1. The second pitch may be less than the first pitch. Each of the first wiring lines M1_I may have a line-width less than that of each of the first and second power lines M1_R1 and M1_R2.

The first metal layer M1 may further include first vias VI1. The first vias VI1 may be correspondingly provided below the lines M1_R1, M1_R2, and M1_I of the first metal layer M1. The first via VI1 may electrically connect the active contact AC to one of the lines M1_R1, M1_R2, M1_R3, and M1_I of the first metal layer M1. The first via VI1 may electrically connect the gate contact GC to one of the lines M1_R1, M1_R2, and M1_I of the first metal layer M1.

A certain line and its underlying first via VI1 of the first metal layer M1 may be formed by individual processes. For example, the certain line and its underlying first via VI1 of the first metal layer M1 may each be formed by a single damascene process. A sub-20 nm process may be employed to fabricate a semiconductor device according to some embodiments.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second lines M2_I may extend in parallel to each other in the first direction D1.

The second metal layer M2 may further include second vias VI2 that are correspondingly provided below the second wiring lines M23. A certain line of the first metal layer M1 may be electrically through the second via VI2 to a corresponding line of the second metal layer M2. For example, a wiring line and its underlying second via VI2 of the second metal layer M2 may be simultaneously formed in a dual damascene process.

The first and second metal layers M1 and M2 may have their wiring lines that include the same or different conductive materials. For example, the wiring lines of the first and second metal layers M1 and M2 may include at least one metallic material selected from aluminum, copper, tungsten, molybdenum, ruthenium, and cobalt. Although not shown, other metal layers (e.g., M3, M4, M5, etc.) may be additionally stacked on the fourth interlayer dielectric layer 140. Each of the stacked metal layers may include wiring lines for routing between cells.

The gate electrode GE and the first channel pattern CH1 on the first active pattern AP1 will be discussed in detail with reference to FIG. 6. The first to third semiconductor patterns SP1 to SP3 of the first channel pattern CH1 may be vertically spaced apart from each other. The first semiconductor pattern SP1 may be a lowermost one of the first to third semiconductor patterns SP1 to SP3. The first and second inner electrodes PO1 and PO2 may be respectively adjacent below the second and third semiconductor patterns SP2 and SP3.

Referring to FIG. 6, a semiconductor device according to inventive concepts may include the insulation pattern IF between the first semiconductor pattern SP1 and the first active pattern AP1. The insulation pattern IF may include a dielectric pattern DP and a protection layer PL. The protection layer PL may be disposed between the dielectric pattern DP and the first semiconductor pattern SP1 and between the dielectric pattern DP and the first active pattern AP1. The protection layer PL may surround the dielectric pattern DP in the second direction D2 and the third direction D3. The protection layer PL may have a thickness less than that of the insulation pattern IF except the protection layer PL. The protection layer PL may include aluminum oxide (AlO).

Referring to FIGS. 5A to 6, the thickness of the insulation pattern IF may be greater than that of each of the first and second inner electrodes PO1 and PO2. The thickness of the insulation pattern IF may range from about 6 nm to about 13 nm.

The dielectric pattern DP may include a dielectric substance. The dielectric substance may include one or more of silicon dioxide ($SiO_2$) and silicon nitride (SiN).

Referring back to FIG. 6, the gate dielectric layer GI may surround each of the first and second inner electrodes PO2 and PO2. The gate dielectric layer GI may surround the insulation pattern IF in the second direction D2 and the third direction D3.

On the first active region AR1, the inner spacer ISP may be interposed between the first source/drain pattern SD1 and the first and second inner electrodes PO1 and PO2 and between the first source/drain pattern SD1 and the insulation pattern IF. The inner spacer ISP may be in direct contact with the first source/drain pattern SD1. The insulation pattern IF and the first and second inner electrodes PO1 and PO2 of the gate electrode GE may each be spaced apart from the first source/drain pattern SD1 across the inner spacer ISP.

The description of the first to third semiconductor patterns SP1 to SP3, the first and second inner electrodes PO1 and PO2, and the inner spacer ISP of FIG. 6 may be identically applied to the second active region AR2 shown in FIG. 5B. An NMOSFET is adopted as an example of the three-dimensional transistor discussed with reference to FIG. 6, but inventive concepts are not limited thereto. In an embodiment, the description of the three-dimensional transistor of FIG. 6 may be applicable to a PMOSFET.

FIGS. 7 to 10D illustrate cross-sectional views showing an example taken along line D-D' of FIG. 4. In the embodiments that follow, a detailed description of technical features repetitive to those discussed above with reference to FIGS. 1 to 6 will be omitted, and a difference thereof will be discussed in detail.

Figure 7:
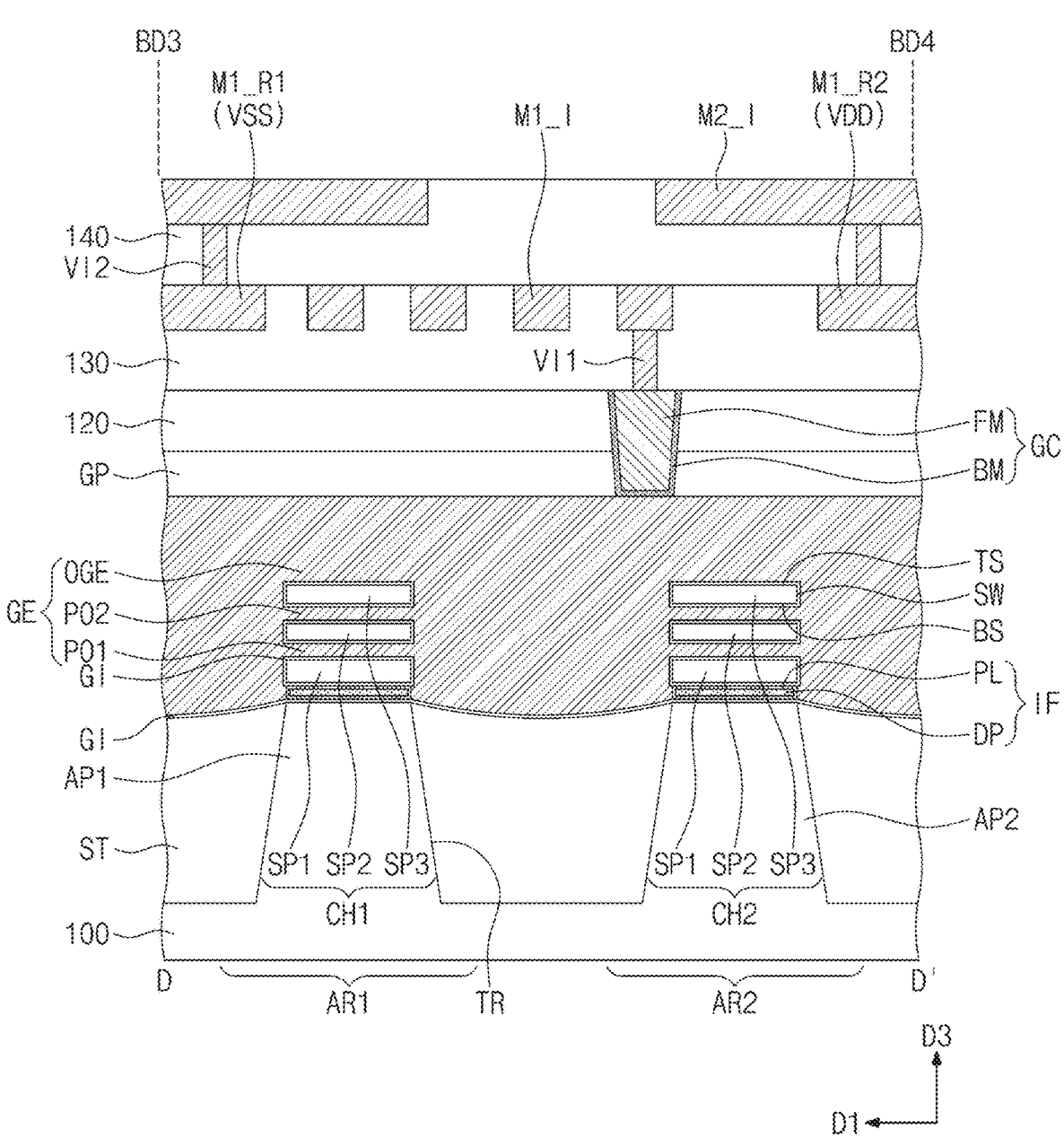
FIGS. 7 to 10D illustrate cross-sectional views showing an example taken along line D-D' of FIG. 4.

Referring to FIG. 7, the thickness of the insulation pattern IF may be less than that of each of the first and second inner electrodes PO1 and PO2. A first sacrificial layer SAL1 at bottom of sacrificial layers SAL of FIG. 11A may have a thickness less than those of sacrificial layers SAL other than the first sacrificial layer SAL1, which may result in the formation of the insulation pattern IF having its small thickness.

Figure 8:
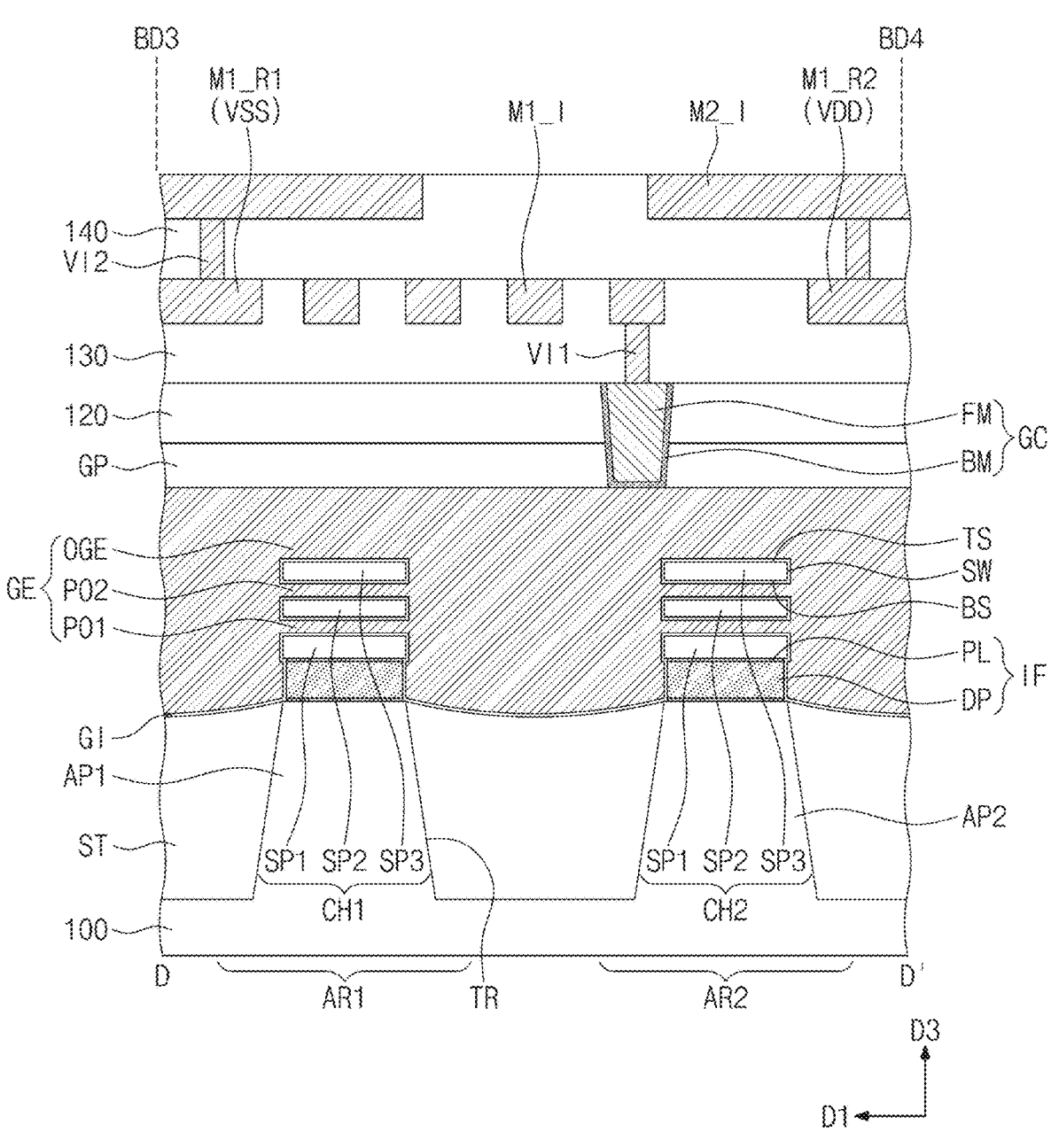

Referring to FIG. 8, the gate dielectric layer GI may cover sidewalls SW of the insulation pattern IF. The gate dielectric layer GI may cover the device isolation layer ST. The gate dielectric layer GI may cover the top surface TS, the bottom surface BS, and the opposite sidewalls SW of each of the second and third semiconductor patterns SP2 and SP3. The gate dielectric layer GI may cover the top surface TS and the sidewalls SW of the first semiconductor pattern SP1. The gate dielectric layer GI that covers the sidewall SW of the first semiconductor pattern SP1 may be connected to the gate dielectric layer GI that covers a sidewall of the insulation pattern IF. The gate dielectric layer GI may not be formed between the insulation pattern IF and the first semiconductor pattern SP1 or between the insulation pattern IF and each of the first and second active patterns AP1 and AP2.

Figure 14A:
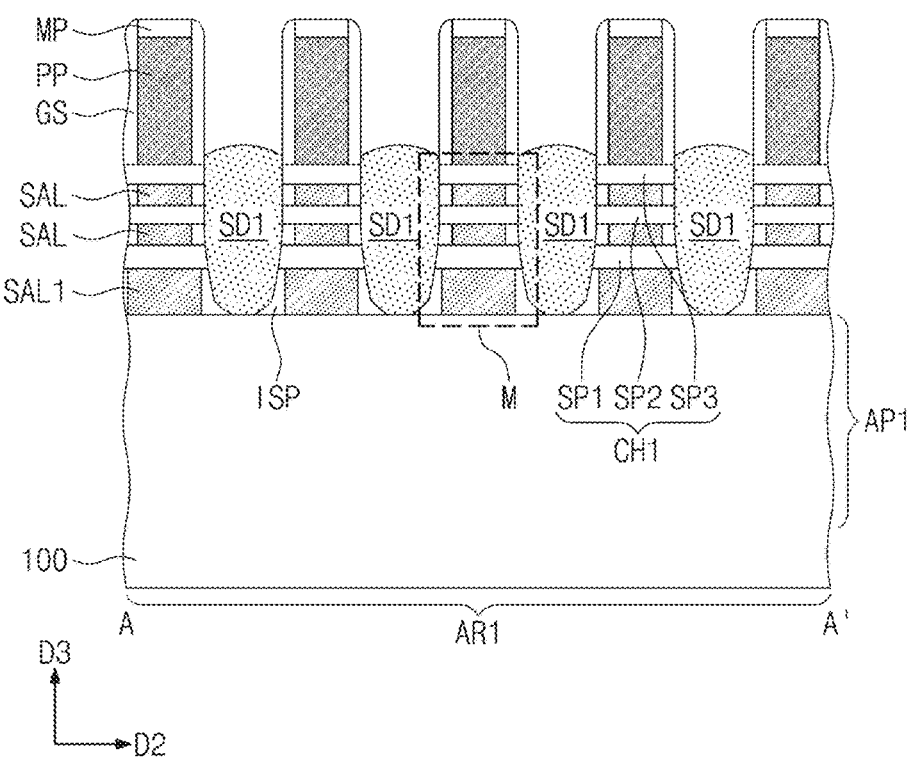
Figure 14B:
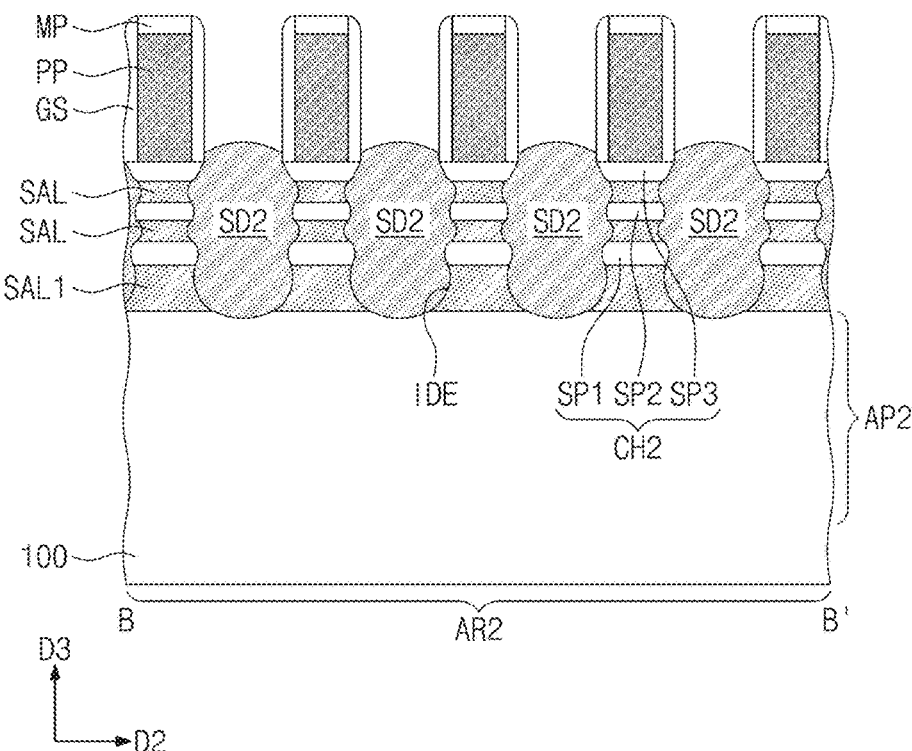

Referring back to FIG. 8, a metal layer MT may fill first to third inner regions IRG1 to IRG3 after sacrificial layers SAL are etched in steps of FIGS. 14A and 14B. As shown in FIGS. 17A to 22B which will be discussed below, the removal of the metal layer MT and the formation of the insulation pattern IF may be identically applied to the embodiment of FIG. 8. After the formation of the insulation pattern IF, the gate dielectric layer GI may be formed. After the formation of the gate dielectric layer GI, the gate electrode GE may be formed on the gate dielectric layer GI.

Figure 9A:
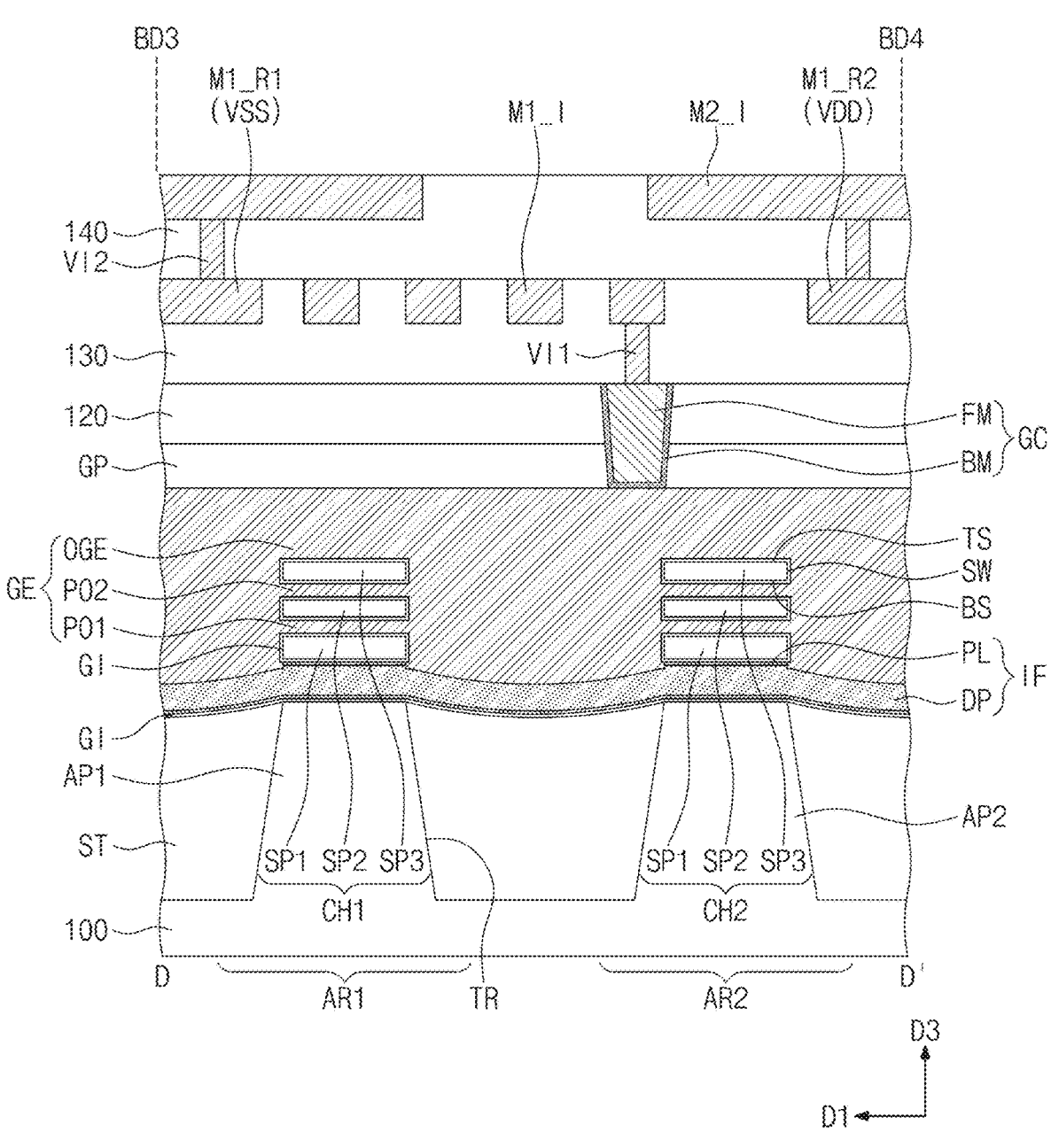

Referring to FIG. 9A, the insulation pattern IF may extend onto the device isolation layer ST between the first semiconductor pattern SP1 and the first active pattern AP1. The gate dielectric layer GI may cover the first and second active patterns AP1 and AP2 and the device isolation layer ST. The protection layer PL may be disposed between the first semiconductor pattern SP1 and the dielectric pattern DP, between the dielectric pattern DP and the first active pattern AP1, and between the dielectric pattern DP and the device isolation layer ST. As the insulation pattern IF covers the device isolation layer ST, it may be possible to limit and/or prevent the occurrence of leakage current due to the first active pattern AP1.

As shown in FIGS. 11A to 18 which will be discussed below, the removal and formation of the metal layer MT may be identically applied to the embodiment of FIG. 9A. Referring to FIG. 19C which will be discussed below, the dielectric pattern DP may fill a first inner region IRG1 and an outer region ORG. The dielectric pattern DP may completely fill a certain region on the device isolation layer ST.

Figure 9B:
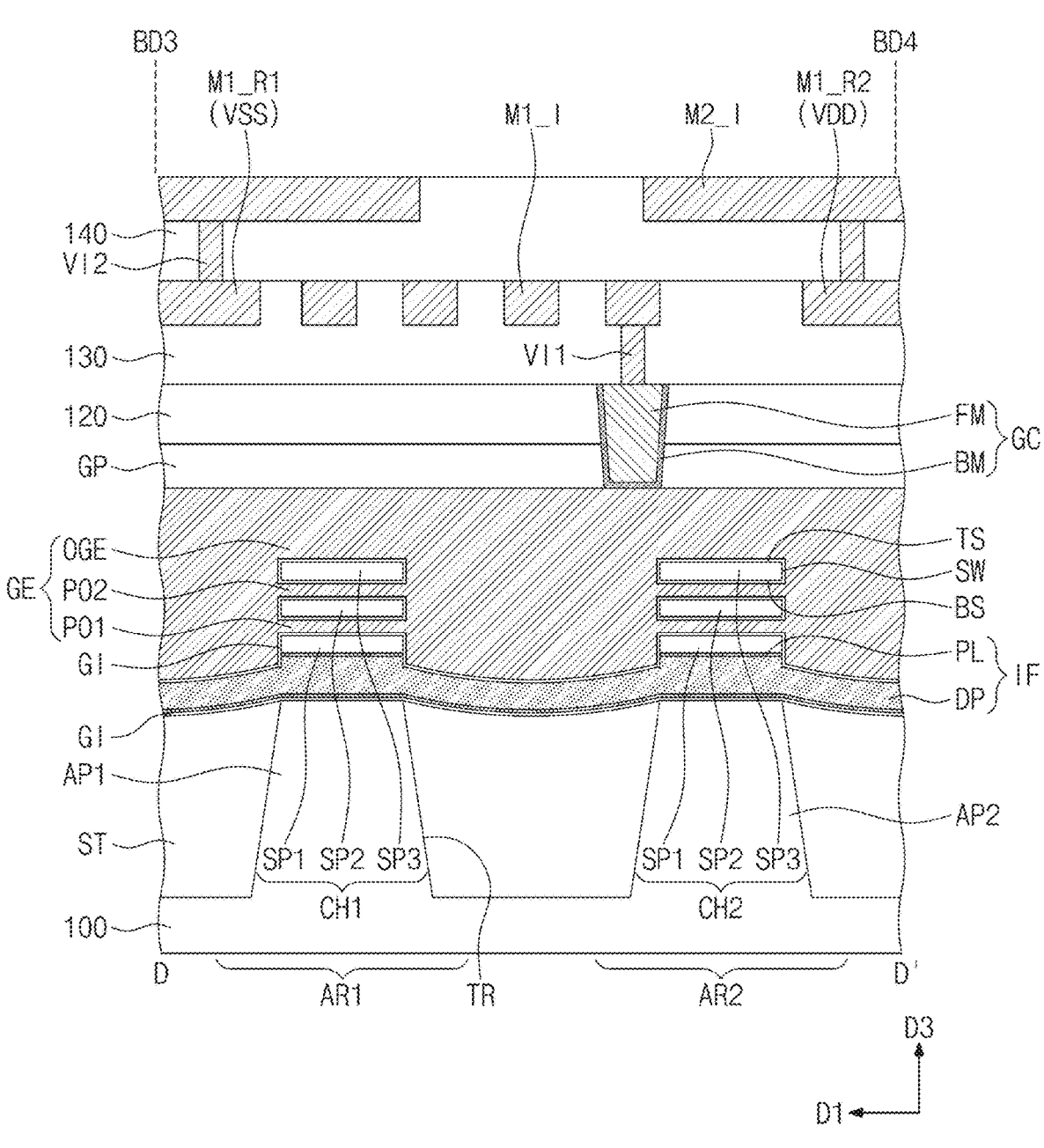

Referring to FIG. 9B, the insulation pattern IF may be formed identically or similarly to the embodiment of FIG. 9A. For example, the insulation pattern IF may extend onto the device isolation layer ST between the first semiconductor pattern SP1 and the first active pattern AP1. The gate dielectric layer GI may cover the top surface TS, the bottom surface BS, and the opposite sidewalls SW of each of the second and third semiconductor patterns SP2 and SP3. The gate dielectric layer GI may cover the top surface TS and the sidewalls SW of the first semiconductor pattern SP1.

The gate dielectric layer GI may cover a top surface of the dielectric pattern DP except a portion covered with the protection layer PL. FIG. 9B depicts that the gate dielectric layer GI covers the first and second active patterns AP1 and AP2 and the device isolation layer ST, but alternatively, the gate dielectric layer GI may not be formed between the insulation pattern IF and each of the first and second active pattern AP1 and AP2 or between the insulation pattern IF and the device isolation layer ST. For example, the protection layer PL formed along a bottom surface of the dielectric pattern DP may be in direct contact with the top surface of the device isolation layer ST and top surfaces of the first and second active patterns AP1 and AP2.

Figure 10A:
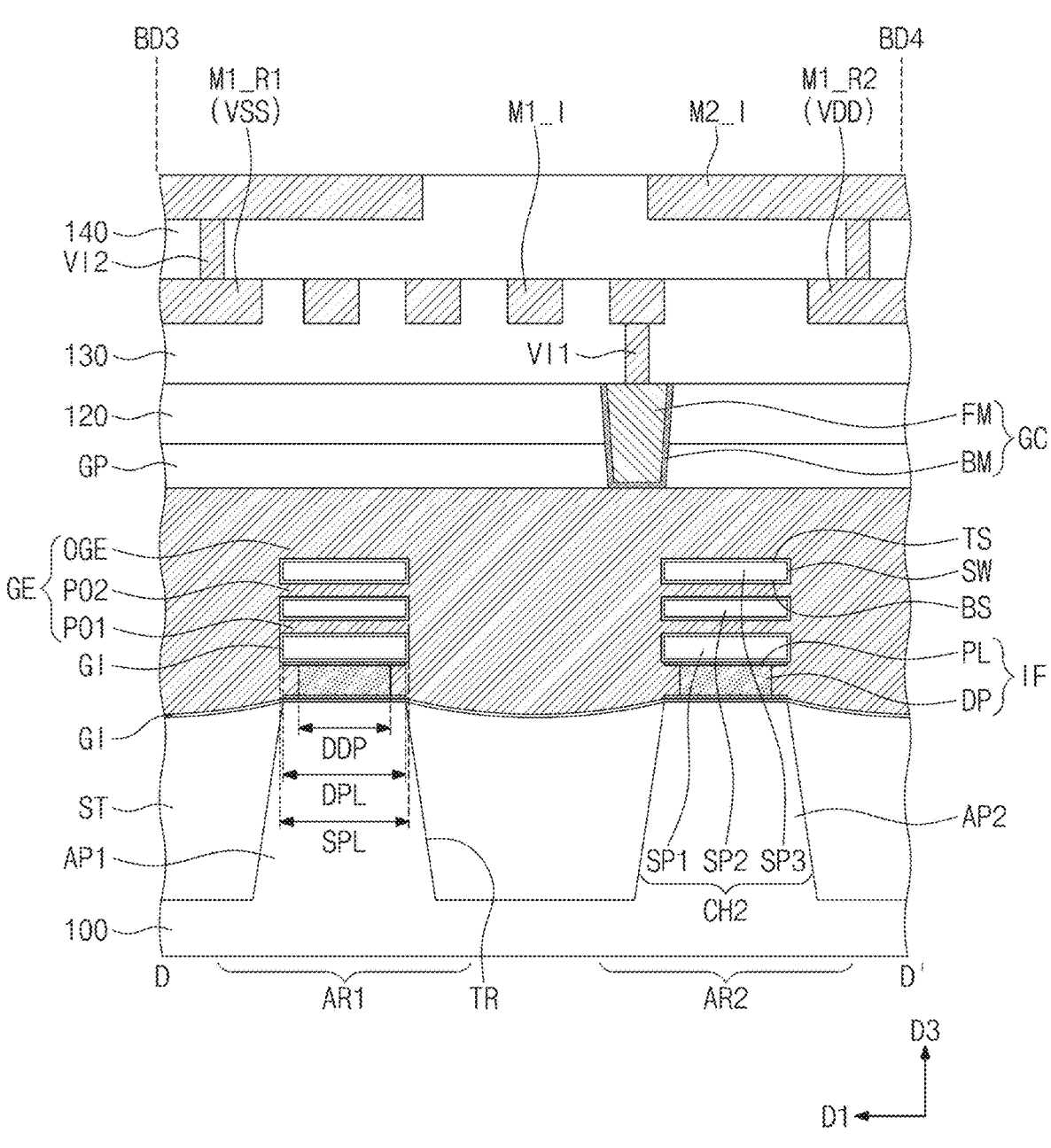

Referring to FIG. 10A, the protection layer PL may have a first width DPL in the first direction D1. The dielectric pattern DP may have a second width DDP in the first direction D1. On the first and second active regions AR1 and AR2 of FIG. 10A, the first width DPL may be greater than the second width DDP. A selective etching process may yield a difference between the first width DPL and the second width DDP. In the etching process, an etch rate of the protection layer PL may be less than that of the dielectric pattern DP.

Figure 10B:
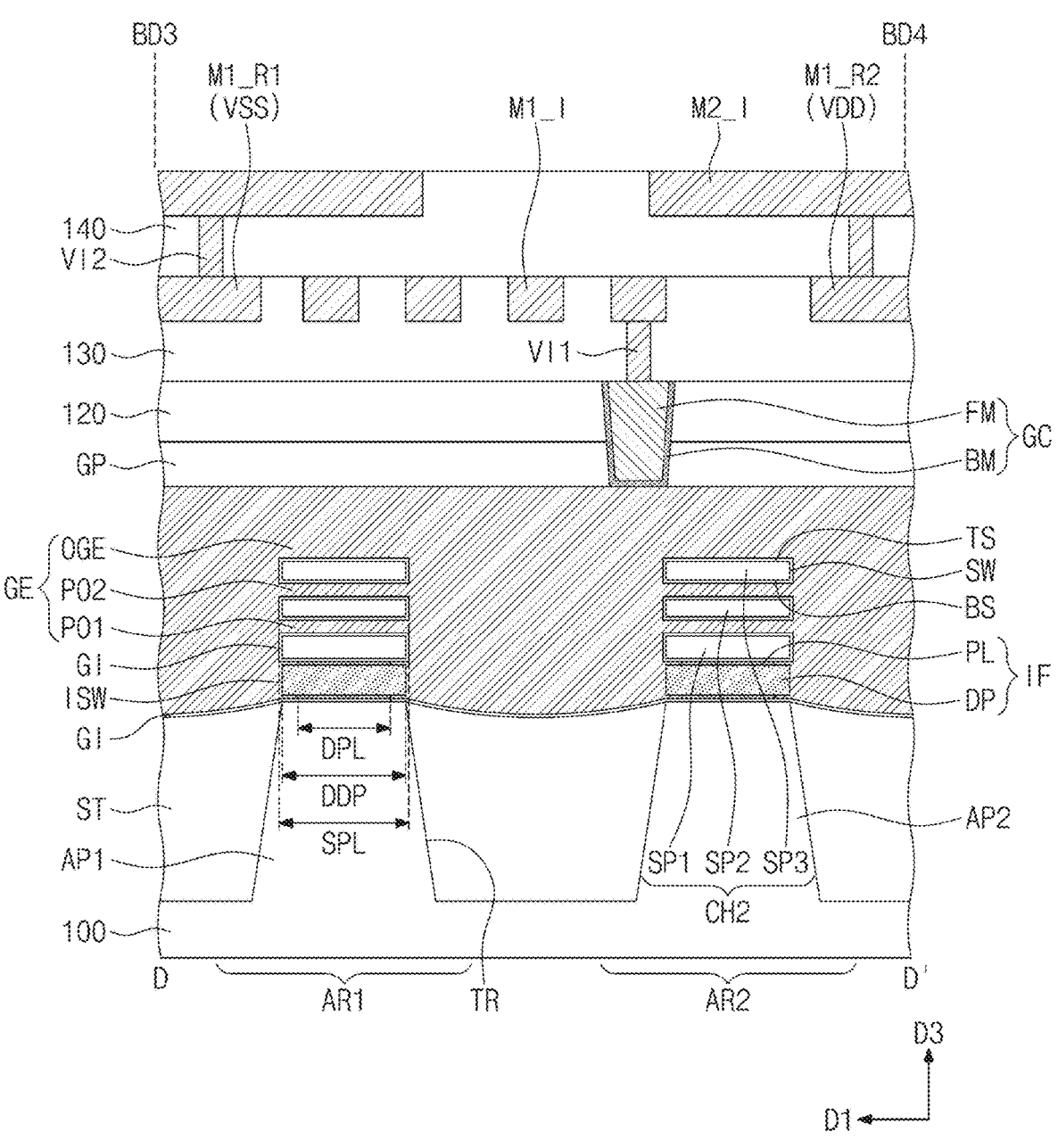

On the first and second active regions AR1 and AR2 of FIG. 10B, the first width DPL may be less than the second width DDP. A selective etching process may yield a difference between the first width DPL and the second width DDP. In the etching process, an etch rate of the protection layer PL may be greater than that of the dielectric pattern DP.

Referring to FIGS. 10A and 10B, the first, second, and third semiconductor patterns SP1, SP2, and SP3 may each have a third width SPL in the first direction D1. The first width DPL and the second width DDP may be less than the third width SPL.

Figure 10C:
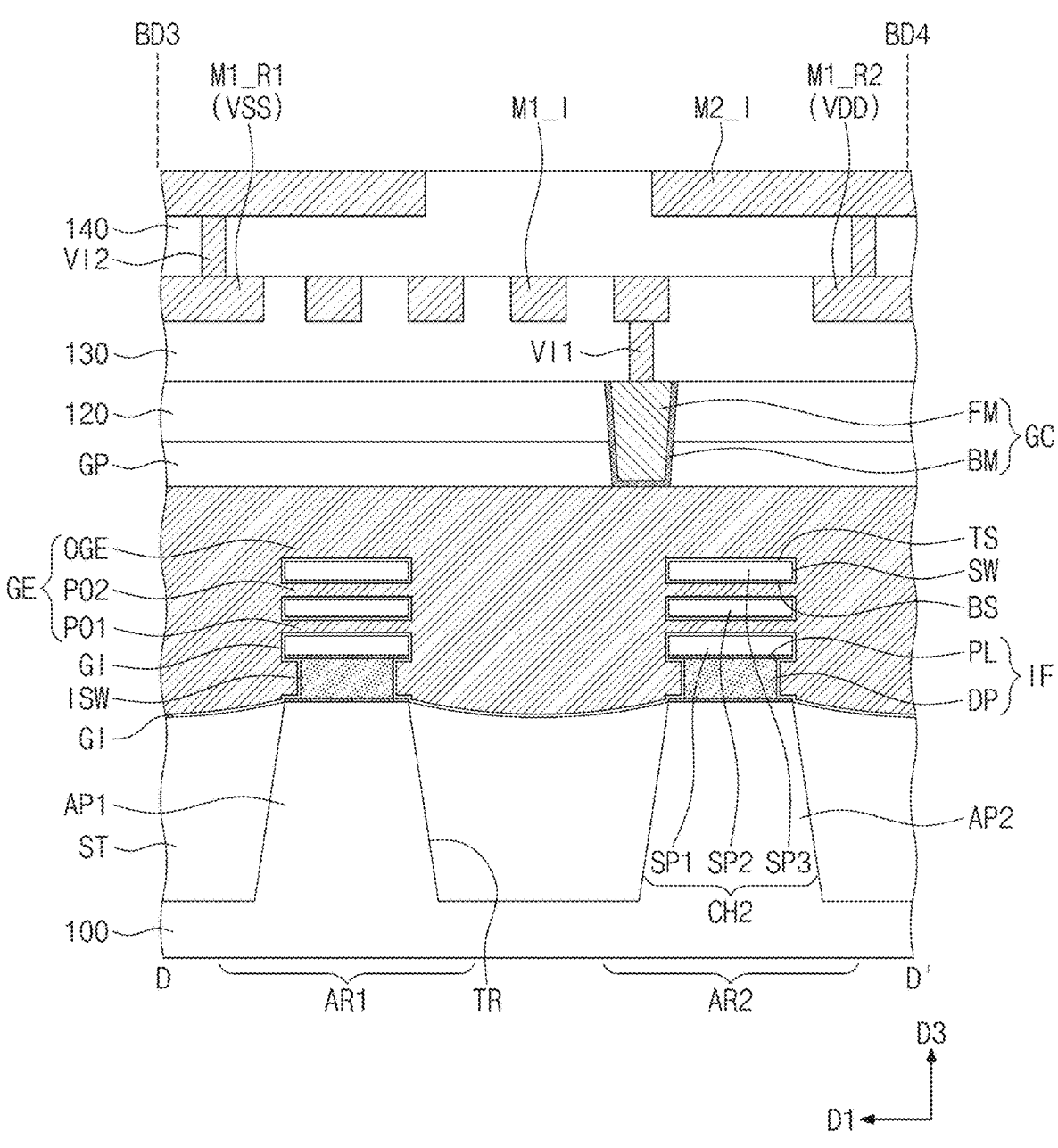
Figure 10D:
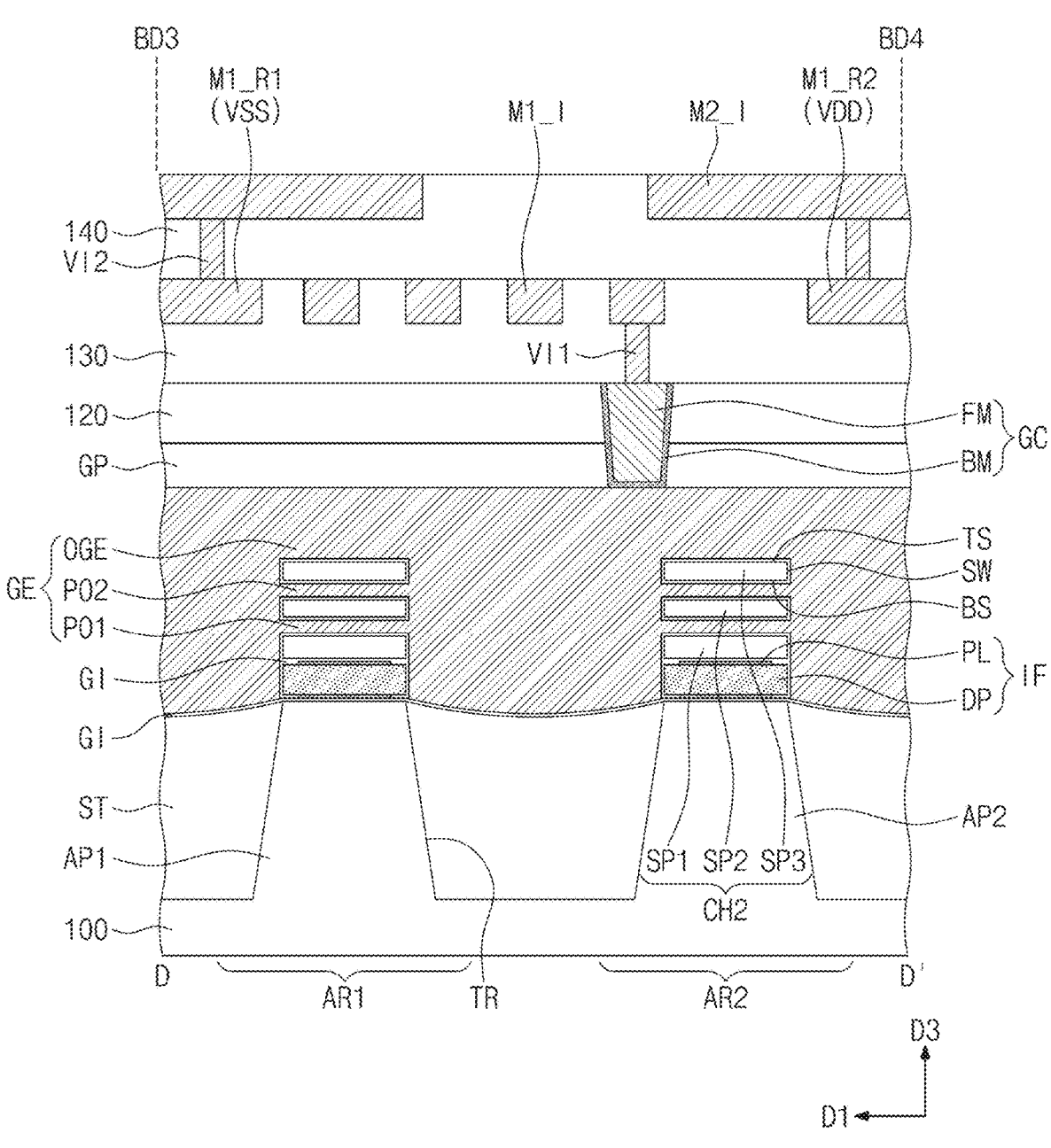

Referring to FIGS. 10C and 10D, the gate dielectric layer GI may cover the top surface TS, the bottom surface BS, and the opposite sidewalls SW of each of the second and third semiconductor patterns SP2 and SP3. The gate dielectric layer GI may cover the top surface TS and the sidewalls SW of the first semiconductor pattern SP1. The gate dielectric layer GI may cover sidewalls ISW of the dielectric layer IF and the device isolation layer ST.

After sacrificial layers SAL are etched in steps of FIGS. 14A and 14B which will be discussed below, a metal layer MT may fill first to third inner regions IRG1 to IRG3. As shown in FIGS. 17A to 22B which will be discussed below, the removal of the metal layer MT and the formation of the insulation pattern IF may be identically applied to each of the embodiments of FIGS. 10C and 10D. After the formation of the insulation pattern IF, the gate dielectric layer GI may be formed. After the formation of the gate dielectric layer GI, the gate electrode GE may be formed on the gate dielectric layer GI.

Figure 11A:
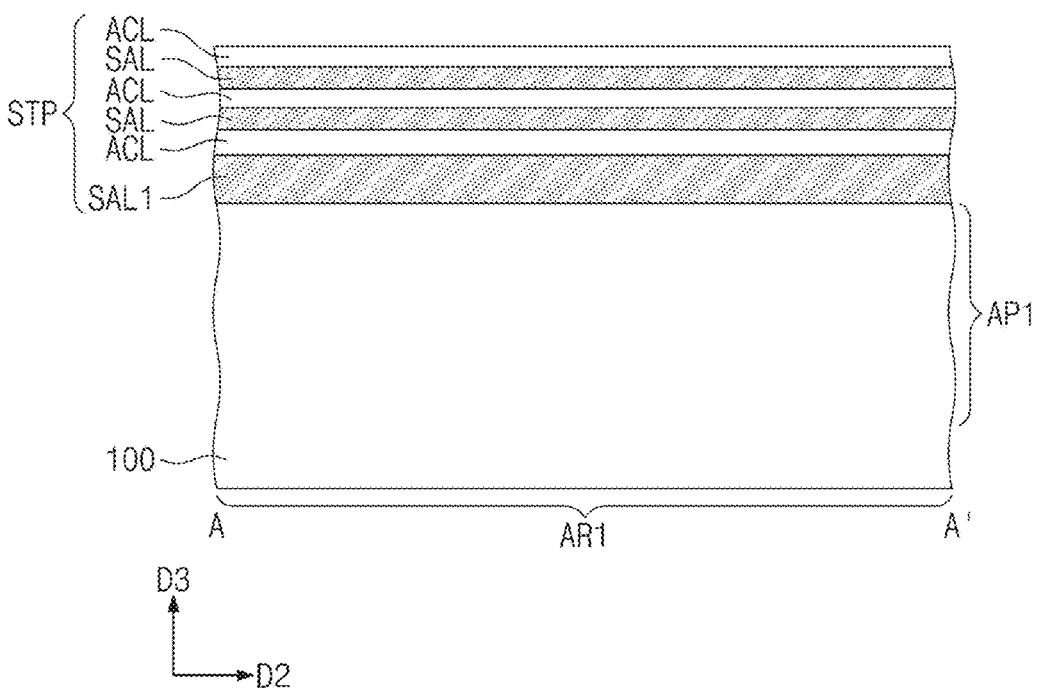
FIGS. 11A and 23B illustrate cross-sectional views showing a method of fabricating a semiconductor device according to some embodiments of inventive concepts.
Figure 13A:
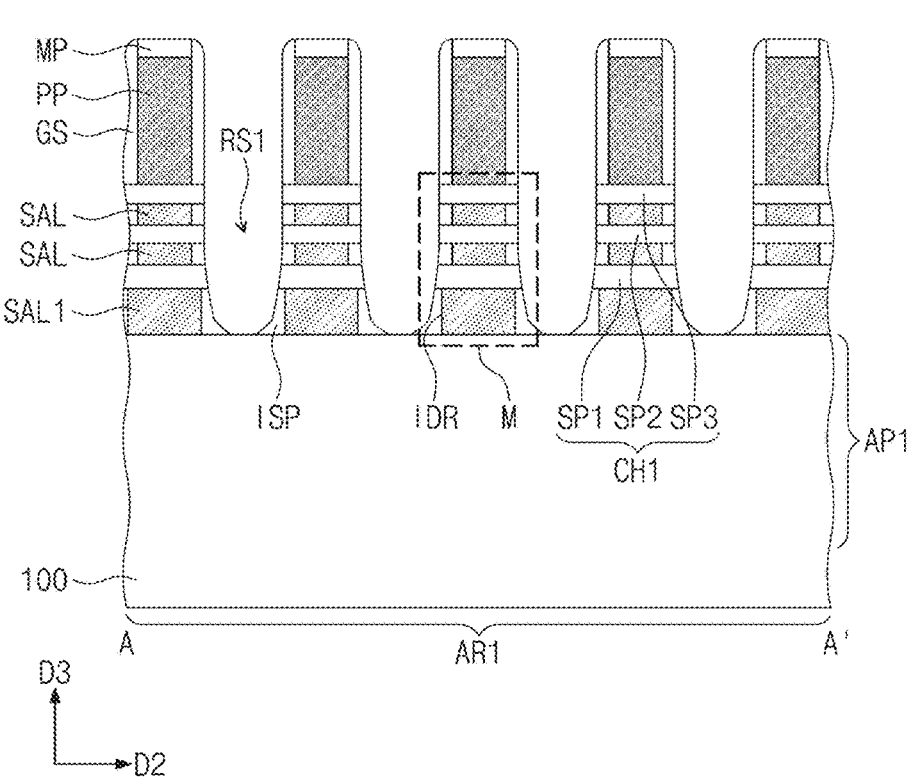
Figure 13B:
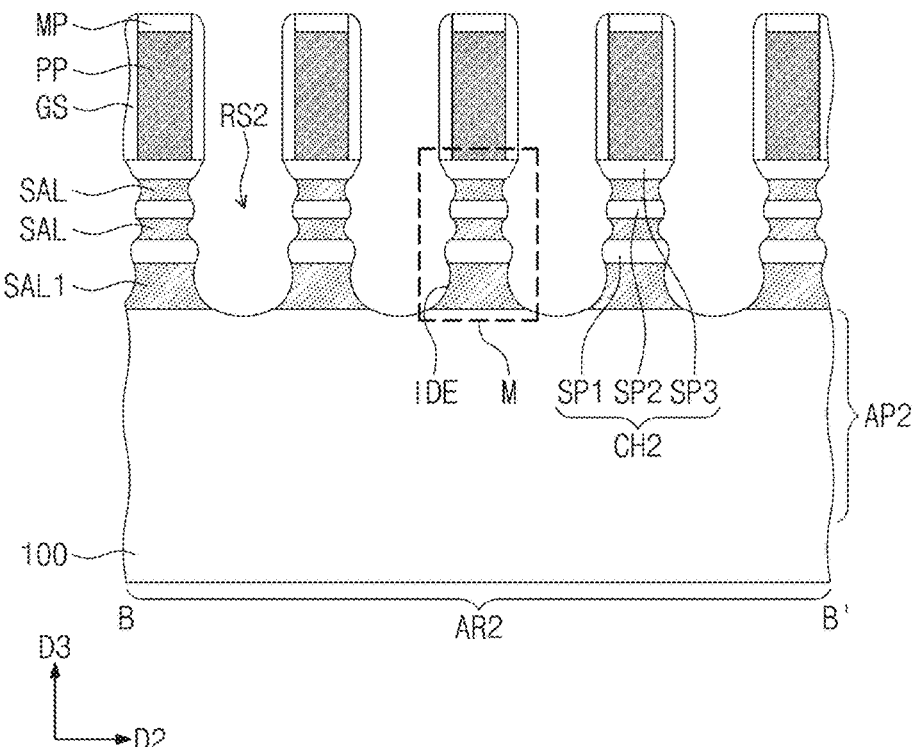
Figure 13C:
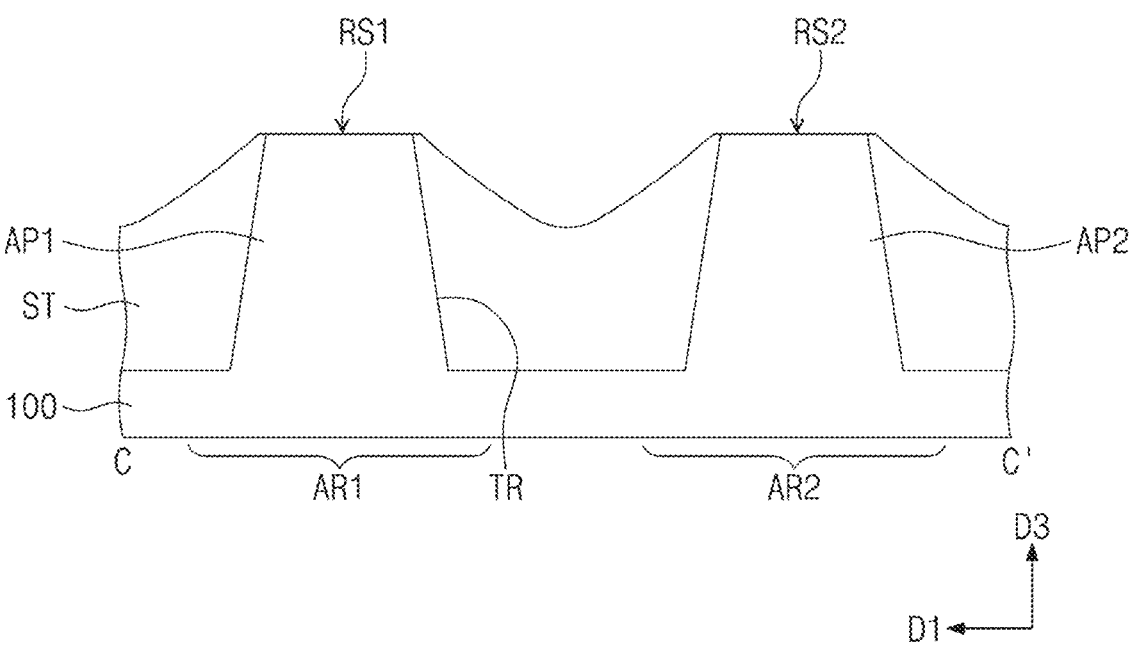
Figure 14C:
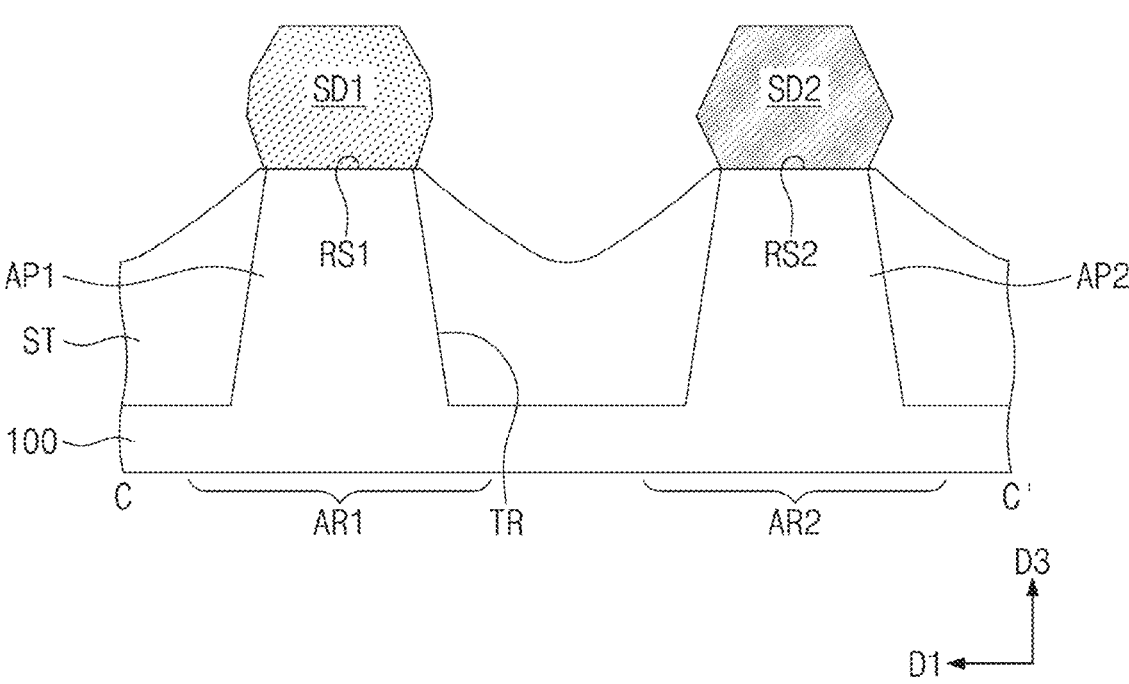
Figure 33:
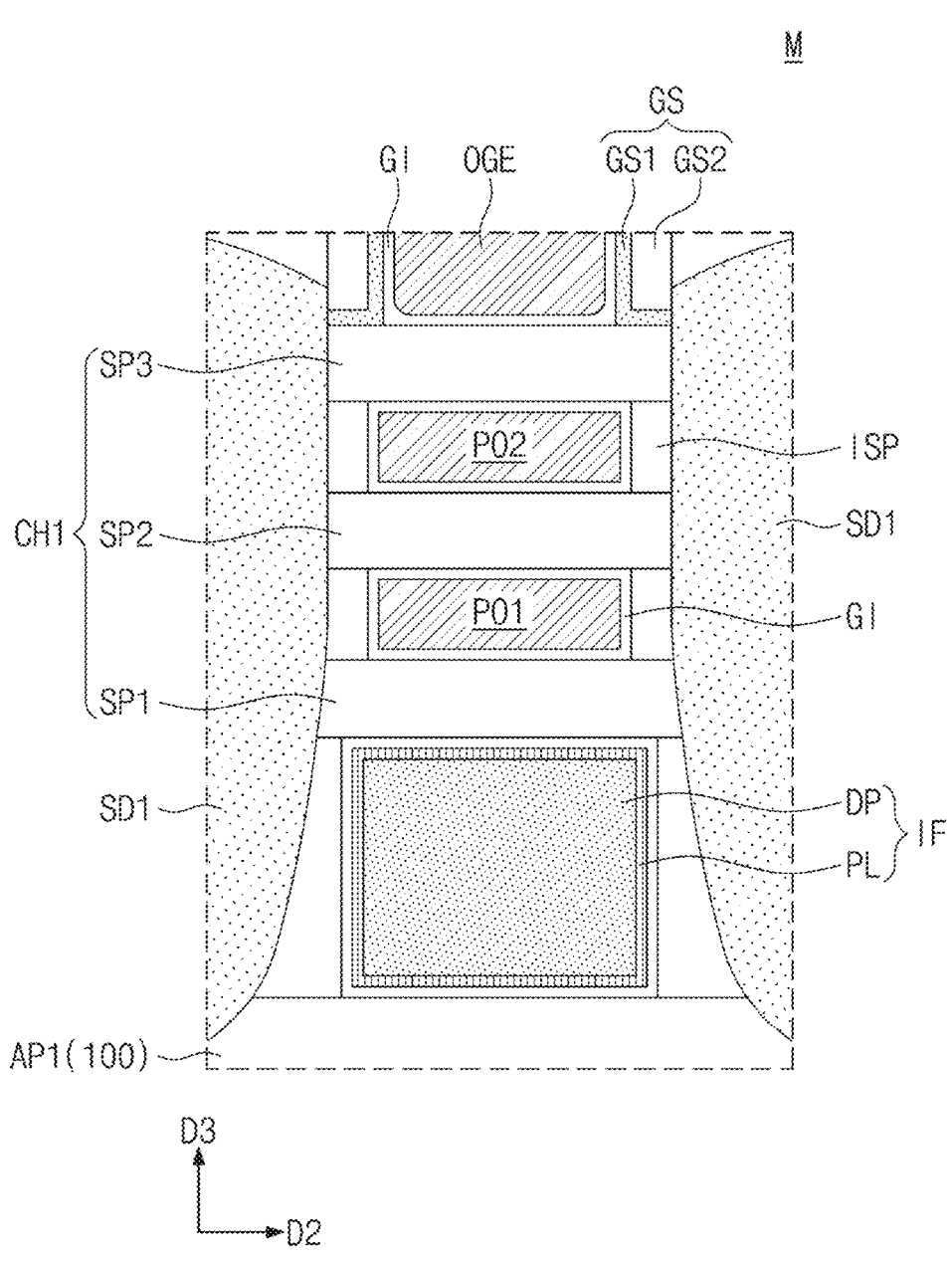

FIGS. 11A and 33 illustrate cross-sectional views showing a method of fabricating a semiconductor device according to some embodiments of inventive concepts. For example, FIGS. 11A, 12A, 13A, 14A, 15A, 16A, 17A, 19A, 21A, 22A, and 23A illustrate cross-sectional views taken along line A-A' of FIG. 4. FIGS. 13B and 14B illustrate cross-sectional views taken along line B-B' of FIG. 4. FIGS. 13C, 14C, and 15C illustrate cross-sectional views taken along line C-C' of FIG. 4. FIGS. 11B, 12B, 15B, 16B, 17B, 18, 19B, 19C, 20, 21B, 22B, and 23B illustrate cross-sectional views taken along line D-D' of FIG. 4.

Figure 25:
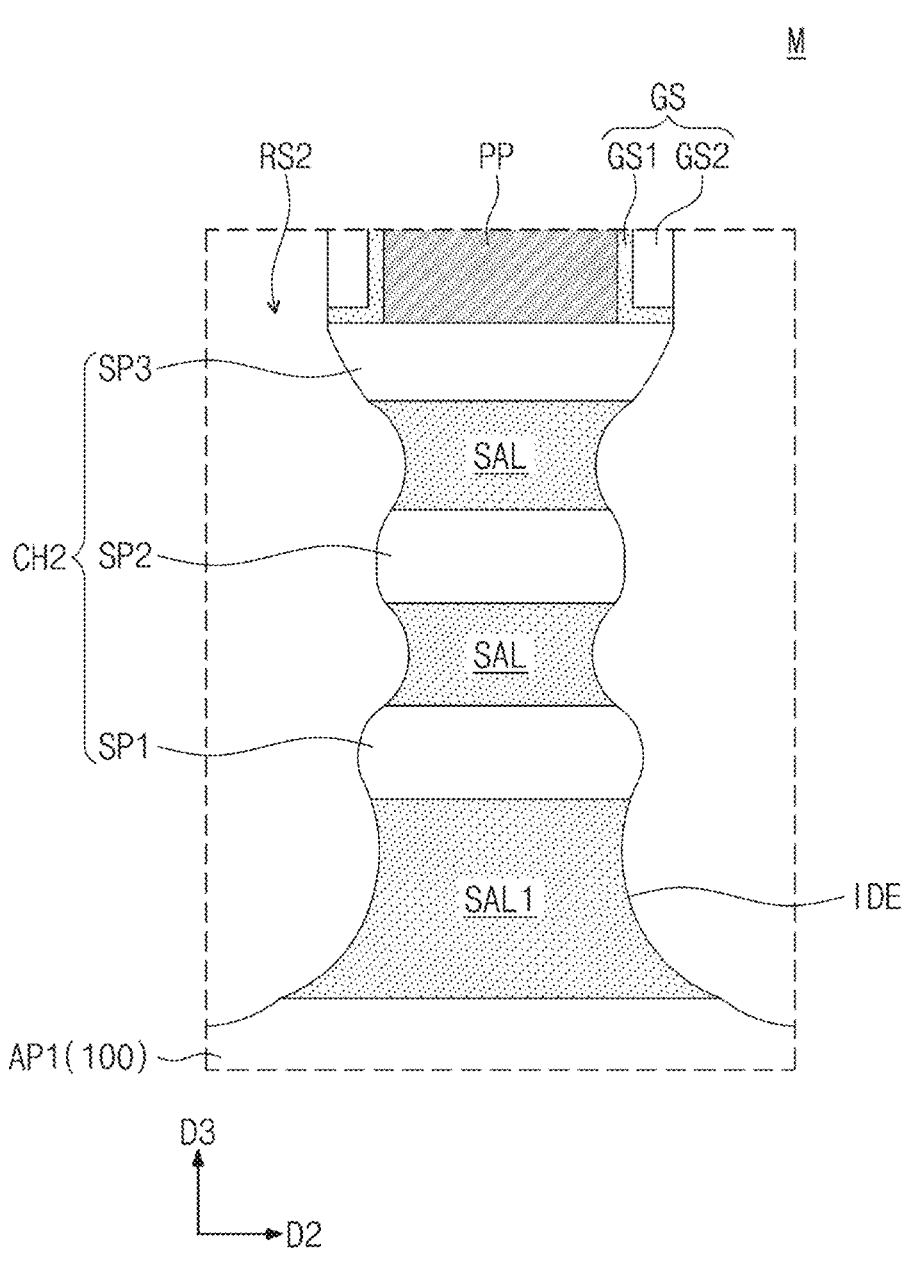
FIG. 25 illustrates an enlarged view showing an example of section M depicted in FIG. 13B.
Figure 26:
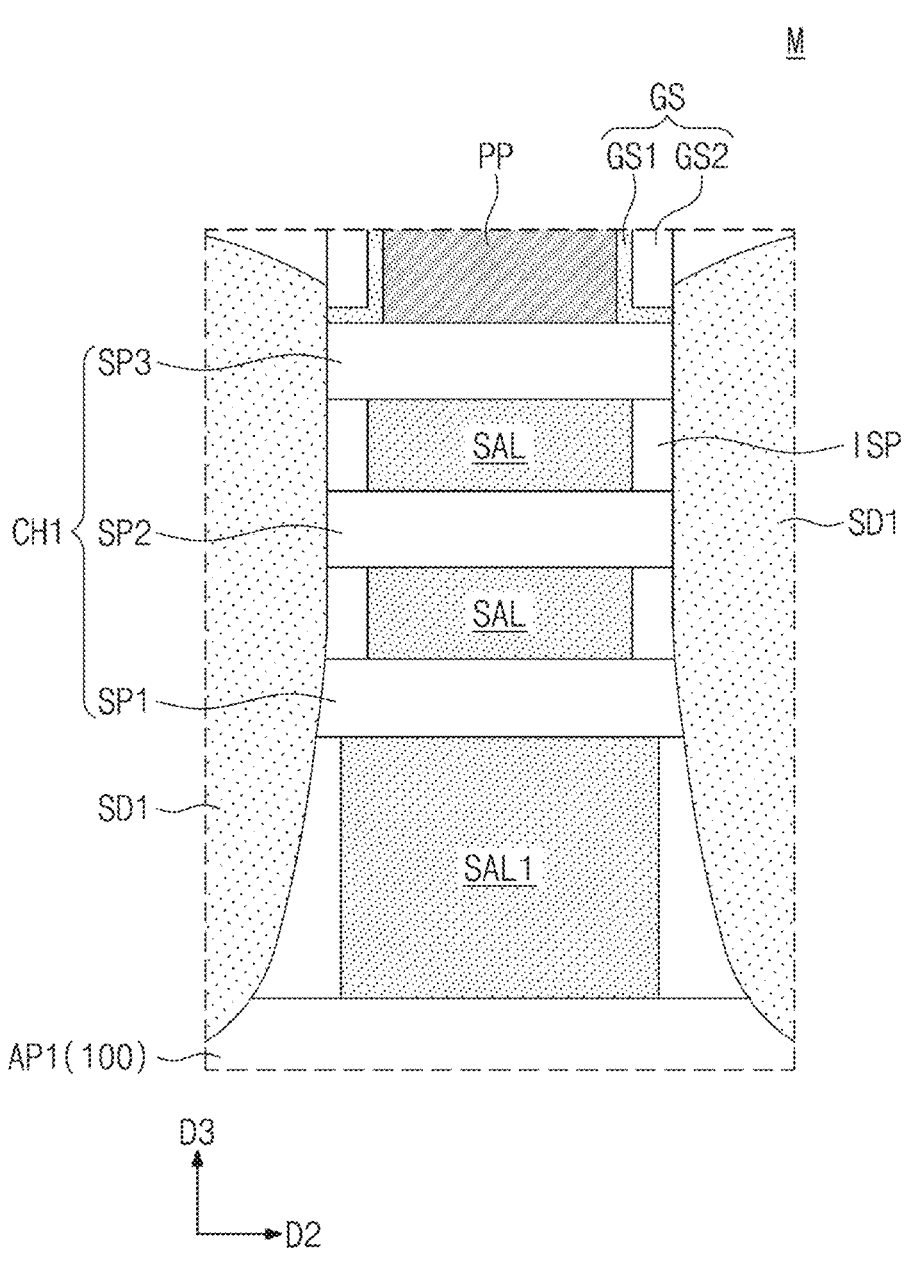
Figure 27:
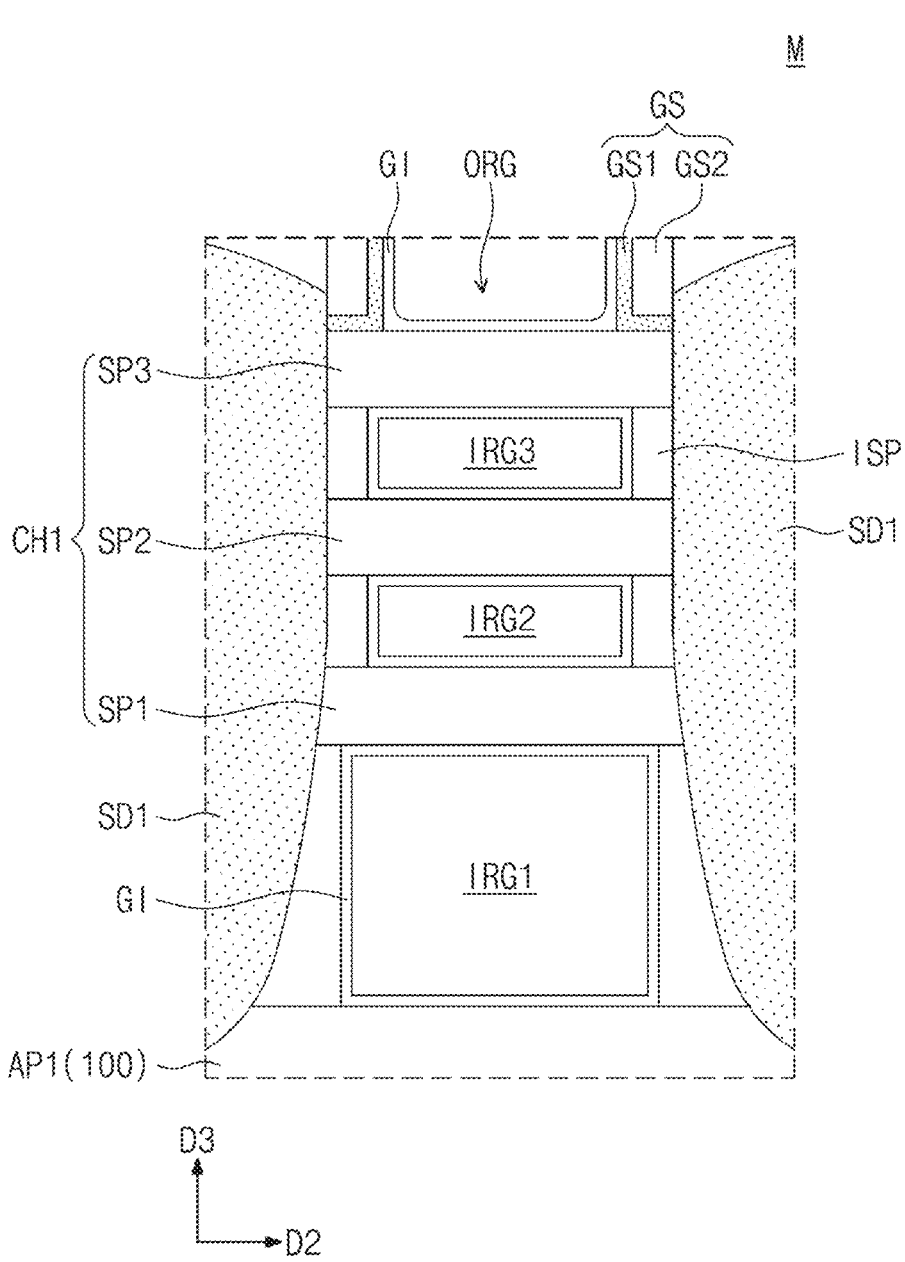

FIGS. 24 and 26 to 33 illustrate enlarged views showing an example of section M depicted in FIGS. 13A to 23A. FIG. 25 illustrates an enlarged view showing an example of section M depicted in FIG. 13B.

Figure 11B:
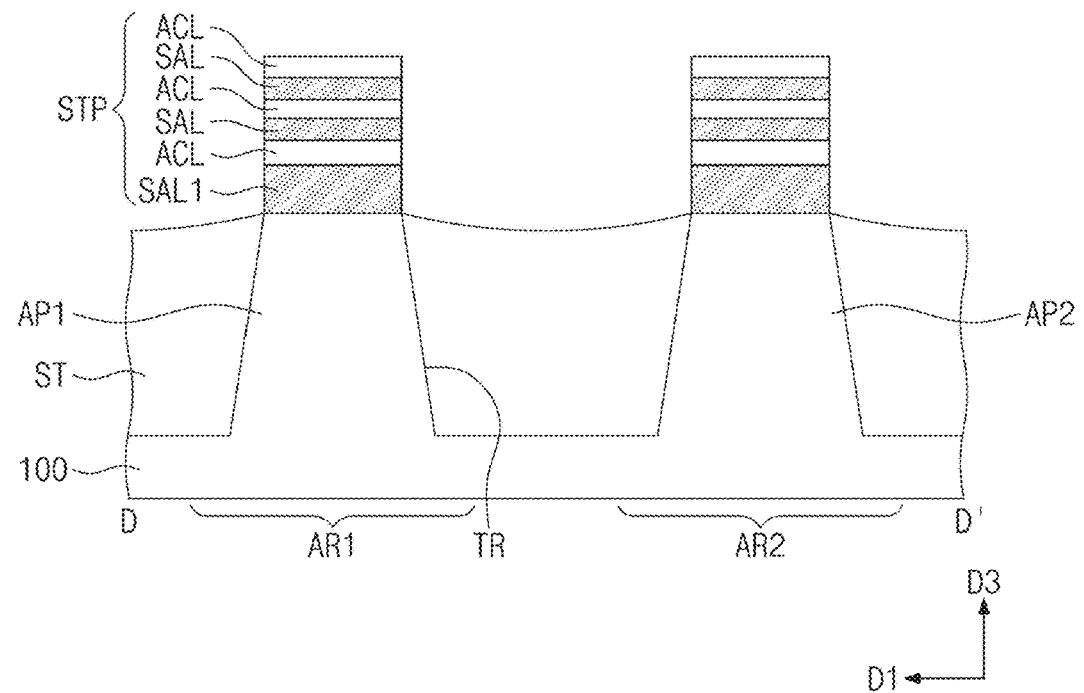

Referring to FIGS. 11A and 11B, a substrate 100 may be provided which includes a first active region AR1 and a second active region AR2. Active layers ACL and sacrificial layers SAL may be alternately stacked on the substrate 100. The active layers ACL may include one of silicon (Si), germanium (Ge), and silicon-germanium (SiGe), and the sacrificial layers SAL may include another of silicon (Si), germanium (Ge), and silicon-germanium (SiGe).

The sacrificial layers SAL may include a lowermost sacrificial layer, or a first sacrificial layer SAL1. As shown in FIGS. 11A and 11B, the first sacrificial layer SAL1 may have a thickness different from those of the sacrificial layers SAL other than the first sacrificial layer SAL1.

The sacrificial layer SAL may include a material having an etch selectivity with respect to the active layer ACL. For example, the active layers ACL may include silicon (Si), and the sacrificial layers SAL may include silicon-germanium (SiGe). Each of the sacrificial layers SAL may have a germanium concentration of about 10 at % to about 30 at %.

Mask patterns may be formed on each of the first and second active regions AR1 and AR2 of the substrate 100. The mask pattern may have a linear or bar shape that extends in a second direction D2.

A patterning process may be performed in which the mask patterns are used as an etching mask to form a trench TR that defines a first active pattern AP1 and a second active pattern AP2. The first active pattern AP1 may be formed on the first active region AR1. The second active pattern AP2 may be formed on the second active region AR2.

A stack pattern STP may be formed on each of the first and second active patterns AP1 and AP2. The stack pattern STP may include the active layers ACL and the sacrificial layers SAL that are alternately stacked. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, and thus the device isolation layer ST may be formed.

The device isolation layer ST may include a dielectric material, such as a silicon oxide layer. The stack patterns STP may be exposed upwardly from the device isolation layer ST. For example, the stack patterns STP may vertically protrude upwards from the device isolation layer ST.

Figure 12A:
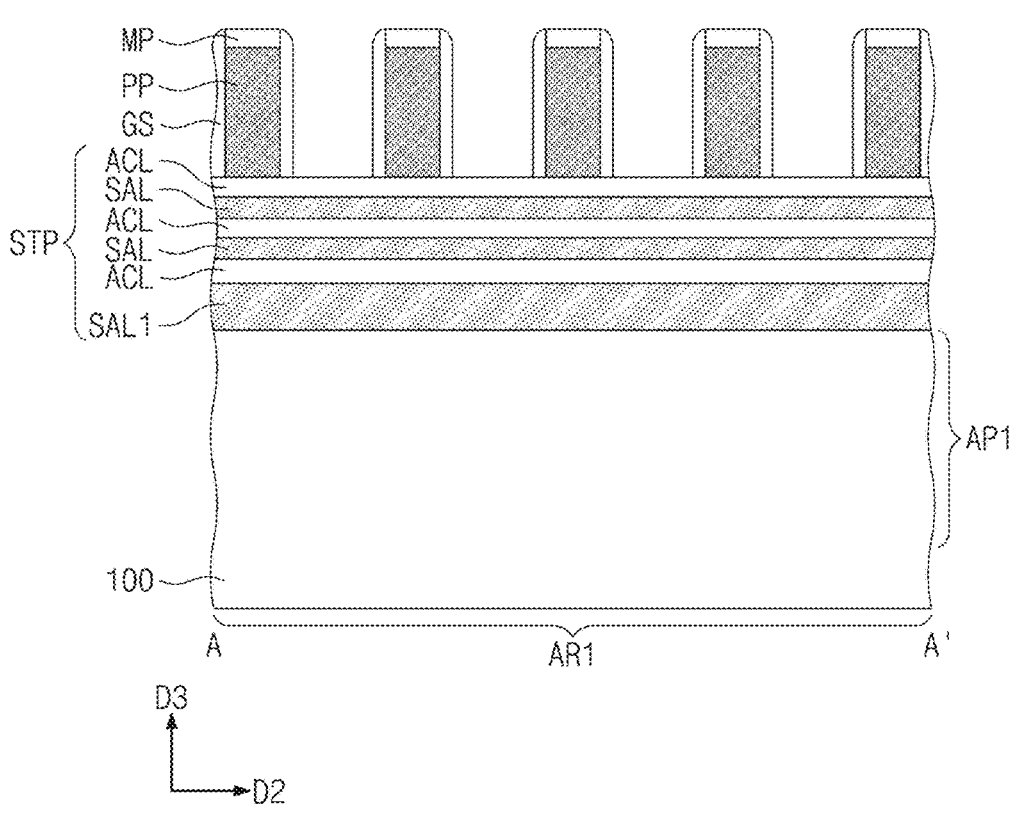
Figure 12B:
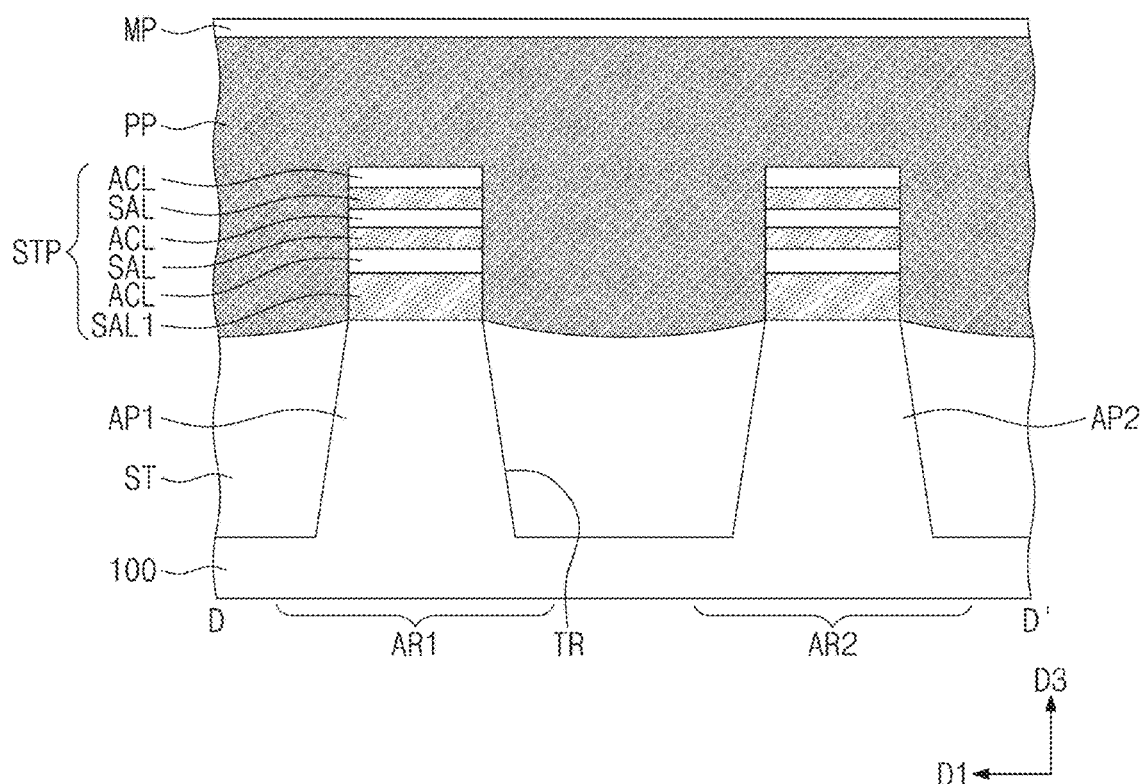

Referring to FIGS. 12A and 12B, sacrificial patterns PP may be formed on the substrate 100, running across the stack patterns STP. Each of the sacrificial patterns PP may be formed to have a linear or bar shape that extends in a first direction D1. The sacrificial patterns PP may be arranged at a first pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. In an embodiment of inventive concepts, the gate spacer GS may be a multiple layer including at least two layers.

Referring to FIGS. 13A to 13C, 24, and 25, first recesses RS1 may be formed in the stack pattern STP on the first active pattern AP1. Second recesses RS2 may be formed in the stack pattern STP on the second active pattern AP2. During the formation of the first and second recesses RS1 and RS2, the device isolation layer ST may be further recessed on opposite sides of each of the first and second active patterns AP1 and AP2.

The hardmask patterns MP and the gate spacers GS may be used as an etching mask to etch the stack pattern STP on the first active pattern AP1 to thereby form the first recesses RS1. The first recess RS1 may be formed between a pair of sacrificial patterns PP.

The active layers ACL may be formed into first, second, and third semiconductor patterns SP1, SP2, and SP3 that are sequentially stacked between neighboring first recesses RS1. A first channel pattern CH1 may be constituted by the first, second, and third semiconductor patterns SP1, SP2, and SP3 between neighboring first recesses RS1.

The first recess RS1 may be formed between neighboring sacrificial patterns PP. A width in the second direction D2 of the first recess RS1 may decrease with decreasing distance from the substrate 100.

The first recess RS1 may expose the sacrificial layers SAL. A selective etching process may be performed on the exposed sacrificial layers SAL. The etching process may include a wet etching process that selectively etches silicongermanium (SiGe). In the etching process, each of the sacrificial layers SAL may be indented to form an indent region IDR. A dielectric layer may be formed in the first recess RS1, filling the indent regions IDR.

An inner spacer ISP may be formed to fill the indent region IDR. For example, the formation of the inner spacer ISP may include wet-etching the dielectric layer until sidewalls of the first, second, and third semiconductor patterns SP1, SP2, and SP3 are exposed. Therefore, the dielectric layer may remain only in the indent region IDR, thereby constituting the inner spacer ISP.

Because the width in the second direction D2 of the first recess RS1 decreases with decreasing distance from the substrate 100, a width in the second direction D2 of the exposed first sacrificial layer SAL1 may be greater than those in the second direction D2 of the exposed other sacrificial layers SAL. The inner spacers ISP formed by the wet etching process may all have the same width in the second direction D2. Therefore, the width in the second direction D2 of the first sacrificial layer SAL1 may be greater than those in the second direction D2 of other sacrificial layers SAL (see FIG. 24).

Referring to FIGS. 13A to 13C and 25, the second recesses RS2 in the stack pattern STP on the second active pattern AP2 may be formed by a method similar to that used for forming the first recesses RS1. The sacrificial layers SAL exposed by the second recess RS2 may undergo a selective etching process to form indent regions IDE on the second active pattern AP2. The indent regions IDE may cause the second recess RS2 to have a wave-shape inner sidewall. A second channel pattern CH2 may be constituted by the first, second, and third semiconductor patterns SP1, SP2, and SP3 between neighboring second recesses RS2.

Referring to FIGS. 14A to 14C and 26, first source/drain patterns SD1 may be correspondingly formed in the first recesses RS1. For example, a first selective epitaxial growth (SEG) process may be performed such that an inner sidewall of the first recess RS1 is used as a seed layer to form an epitaxial layer that fills the first recess RS1. The epitaxial layer may grow from a seed, or the first to third semiconductor patterns SP1 to SP3, the sacrificial layers SAL, and the first active pattern AP1 (or an upper portion of the substrate 100) that are exposed by the first recess RS1. For example, the first SEG process may include chemical vapor deposition (CVD) or molecular beam epitaxy (MBE).

In an embodiment of inventive concepts, the first source/drain pattern SD1 may include the same semiconductor element (e.g., Si) as that of the substrate 100. While the first source/drain pattern SD1 is formed, impurities (e.g., phosphorus, arsenic, or antimony) may be in-situ implanted to allow the first source/drain pattern SD1 to have an n-type. Alternatively, after the formation of the first source/drain pattern SD1, impurities may be implanted into the first source/drain pattern SD1.

Second source/drain patterns SD2 may be correspondingly formed in the second recesses RS2. For example, a second selective epitaxial growth (SEG) process may be performed in which an inner wall of the second recess RS2 is used as a seed to form the second source/drain pattern SD2. The second source/drain pattern SD2 may grow from a seed, or the first to third semiconductor patterns SP1 to SP3, the sacrificial layers SAL, and the second active pattern AP2 (or an upper portion of the substrate 100) that are exposed by the second recess RS2.

In an embodiment of inventive concepts, the second source/drain pattern SD2 may include a semiconductor element (e.g., SiGe) whose lattice constant is greater than that of a semiconductor element of the substrate 100. While the second source/drain pattern SD2 is formed, impurities (e.g., boron, gallium, or indium) may be in-situ implanted to allow the second source/drain pattern SD2 to have a p-type. Alternatively, after the formation of the second source/drain pattern SD2, impurities may be implanted into the second source/drain pattern SD2.

Figure 15A:
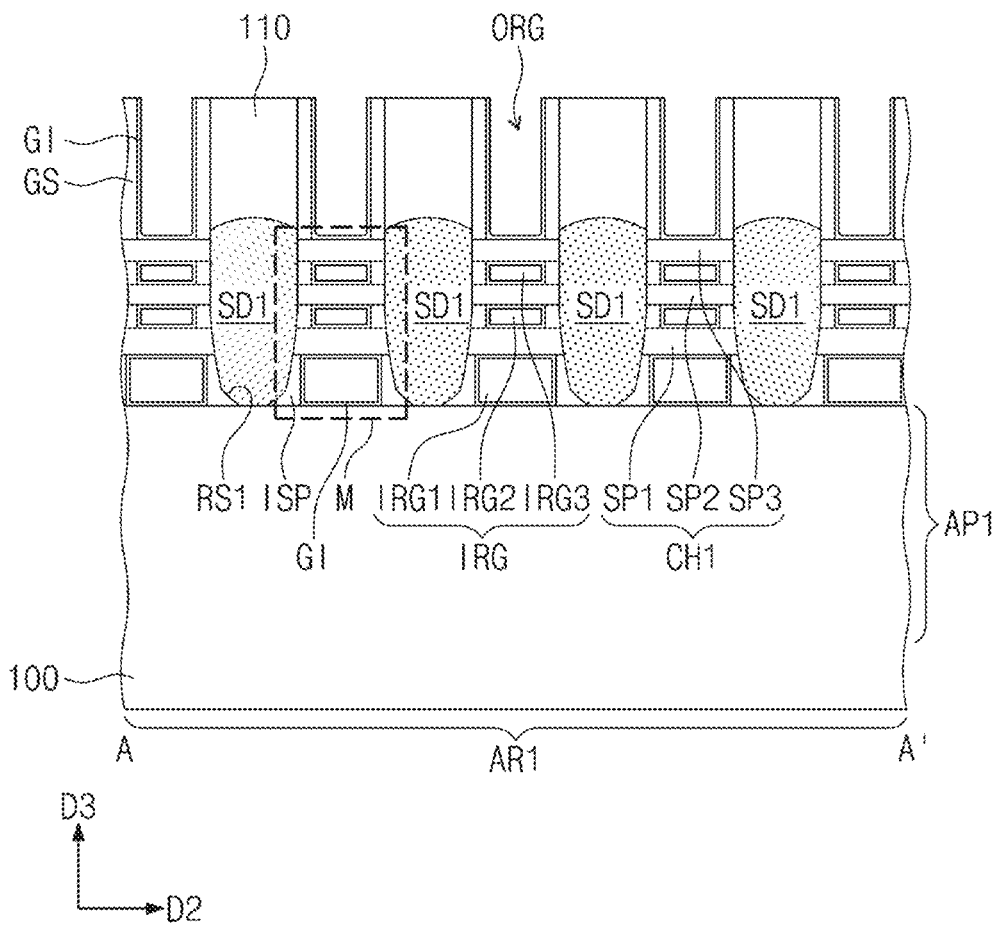
Figure 15B:
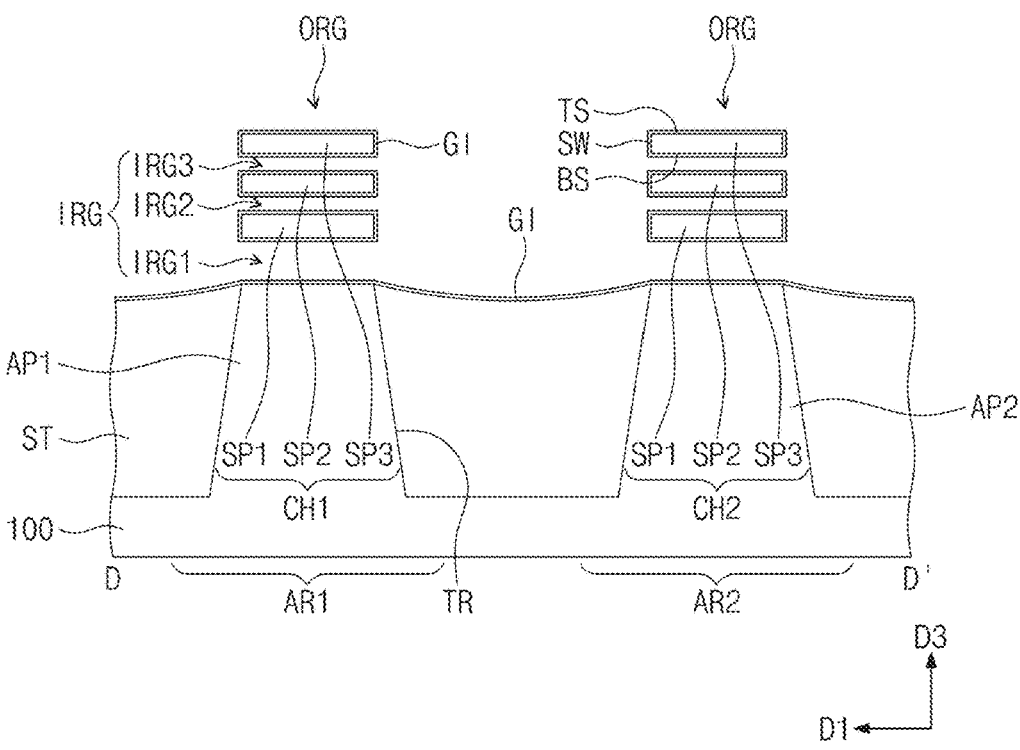
Figure 15C:
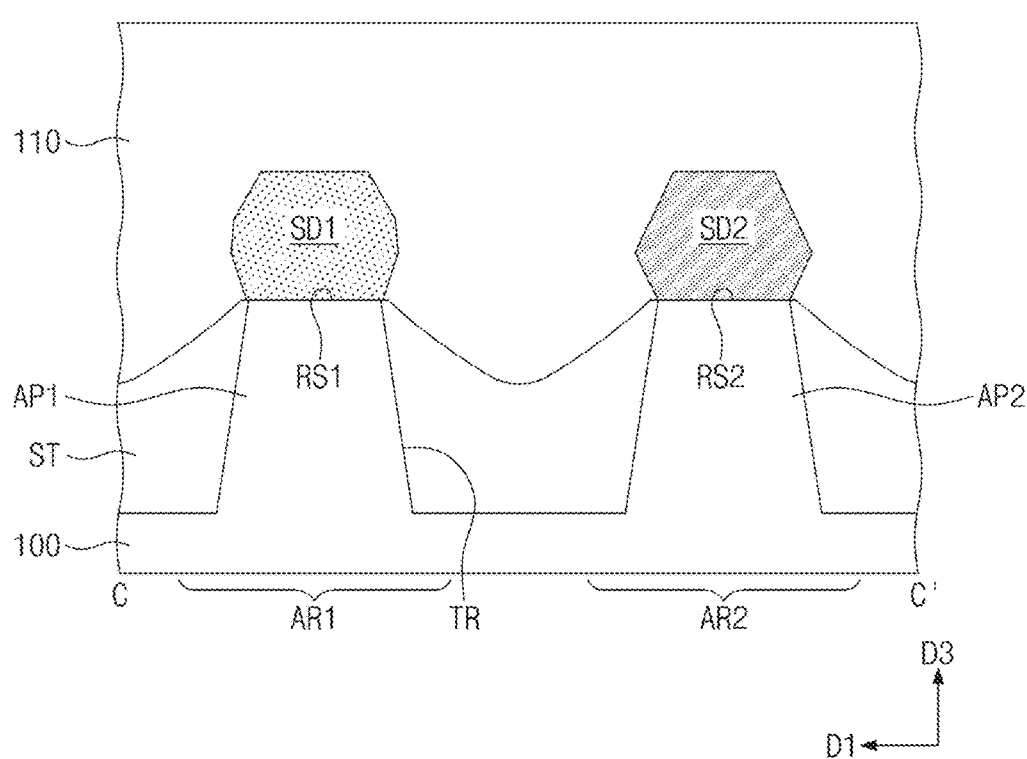

Referring to FIGS. 15A to 15C, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

The exposed sacrificial patterns PP may be selectively removed. The removal of the sacrificial patterns PP may form an outer region ORG that exposes the first and second channel patterns CH1 and CH2 (see FIG. 15B). The removal of the sacrificial patterns PP may include performing a wet etching process using an etchant that selectively etches polysilicon.

The sacrificial layers SAL exposed through the outer region ORG may be selectively removed to form inner regions IRG (see FIG. 15B). For example, an etching process that selectively etches the sacrificial layers SAL may be performed such that only the sacrificial layers SAL are removed while leaving the first, second, and third semiconductor patterns SP1, SP2, and SP3. The etching process may have a high etch rate with respect to silicon-germanium (SiGe) having a relatively high germanium (SiGe) concentration. For example, the etching process may have a high etch rate with respect to silicon-germanium (SiGe) whose germanium (Ge) concentration is greater than about 10 at %.

The etching process may remove the sacrificial layers SAL on the first and second active regions AR1 and AR2. The etching process may be a wet etching process. An etching material used for the etching process may promptly etch the sacrificial layer SAL whose germanium (Ge) concentrate is relatively high.

Referring back to FIG. 15B, as the sacrificial layers SAL are selectively removed, only the stacked first, second, and third semiconductor patterns SP1, SP2, and SP3 may remain on each of the first and second active patterns AP1 and AP2. The removal of the sacrificial layers SAL may form first, second, and third inner regions IRG1, IRG3, and IRG3.

For example, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 15A to 15C, a gate dielectric layer GI may be formed on the exposed first to third semiconductor patterns SP1 to SP3. The gate dielectric layer GI may surround each of the first to third semiconductor patterns SP1 to SP3. The gate dielectric layer GI may be formed in each of the first to third inner regions IRG1 to IRG3. The gate dielectric layer GI may be formed in the outer region ORG. The formation of the gate dielectric layer GI may include sequentially forming a silicon oxide layer and a high-k dielectric layer.

Figure 16A:
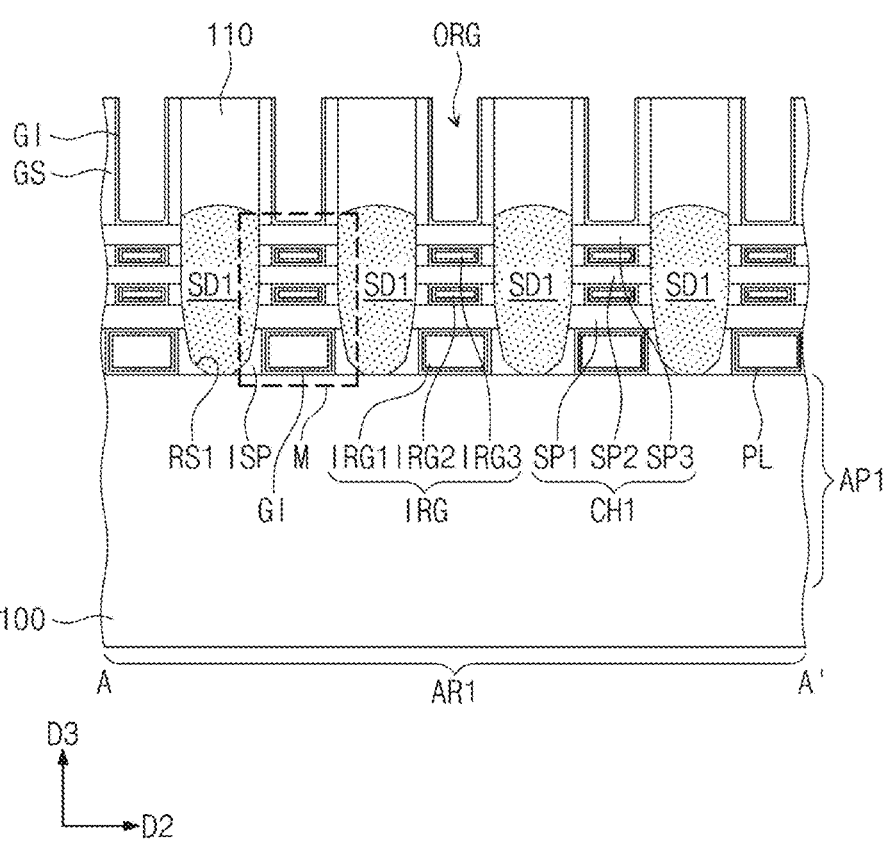
Figure 16B:
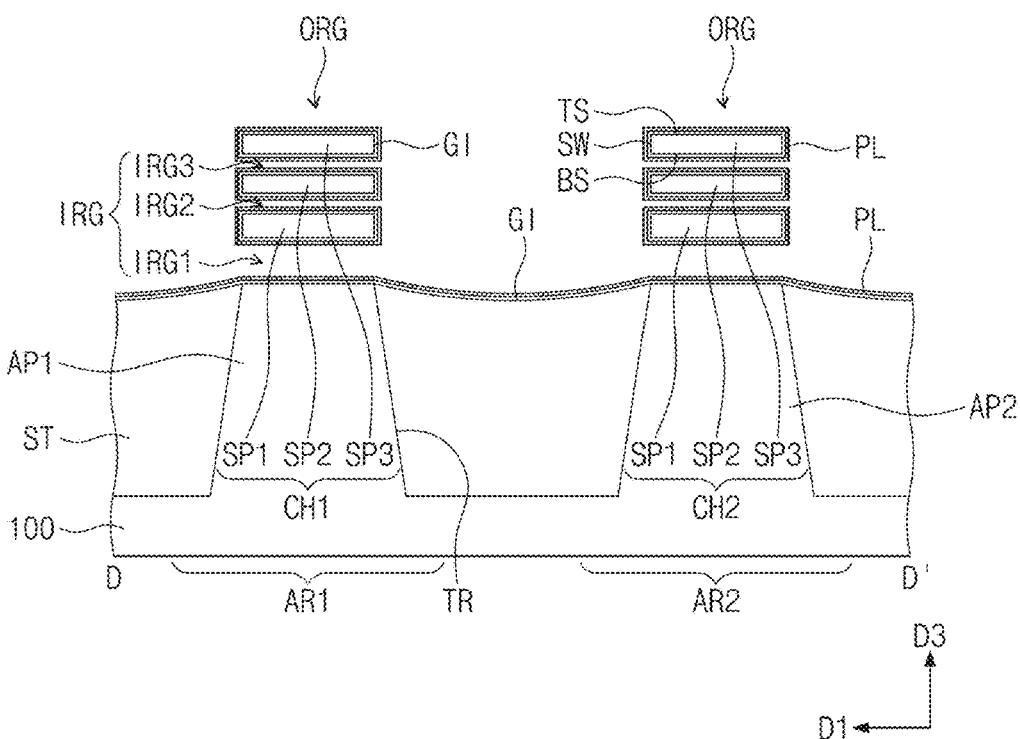
Figure 28:
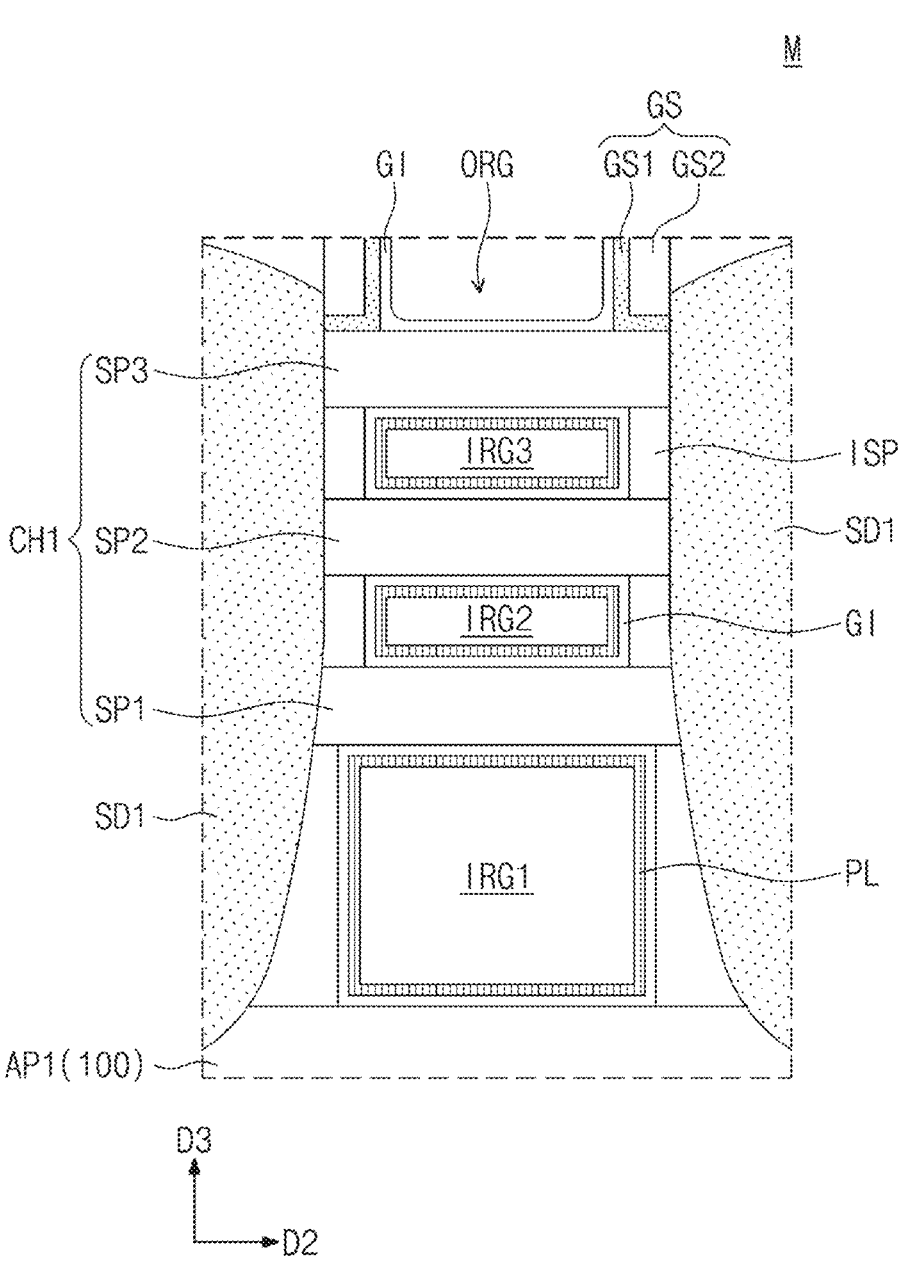

Referring to FIGS. 16A, 16B, and 28, a protection layer PL may be formed on the gate dielectric layer GI that surrounds each of the first to third semiconductor patterns SP1 to SP3. The protection layer PL may be formed to enclose the gate dielectric layer GI that surrounds each of the first to third semiconductor patterns SP1 to SP3. As shown in FIG. 16A, the protection layer PL may be formed in each of the first to third inner regions IRG1 to IRG3. The protection layer PL may be formed more inside than the gate dielectric layer GI formed in each of the first to third inner regions IRG1 to IRG3 (see FIG. 28).

As shown in FIG. 16B, the protection layer PL may be formed to surround the gate dielectric layer GI, and thus may protect the gate dielectric layer GI and the first to third semiconductor patterns SP1 to SP3 from an etching process.

Figure 17A:
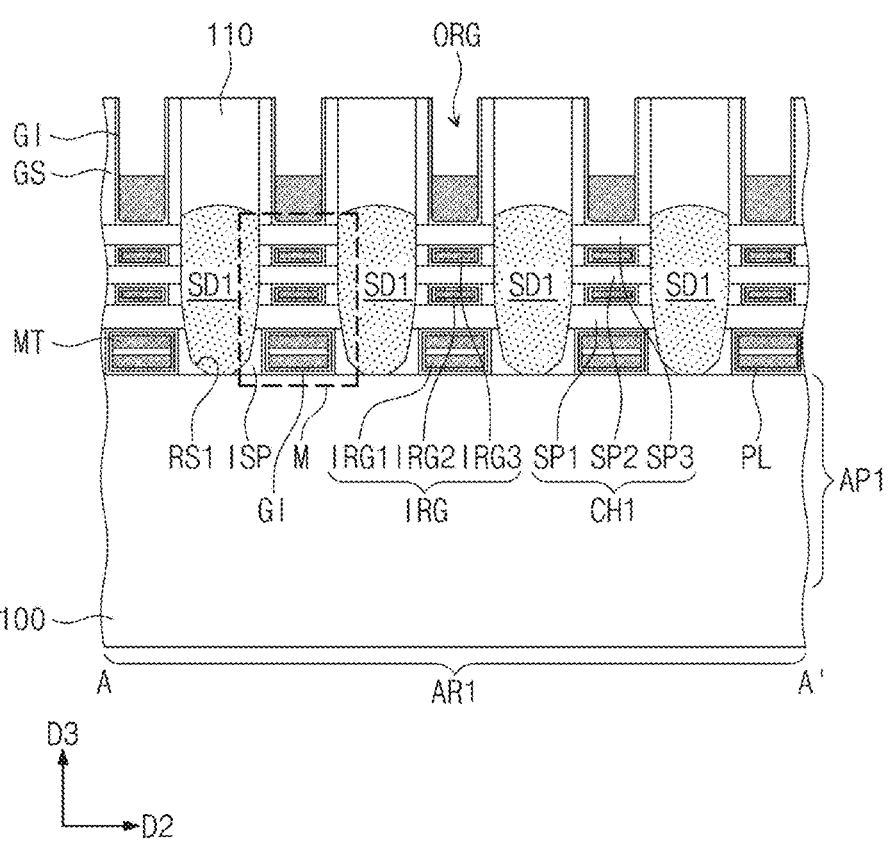
Figure 17B:
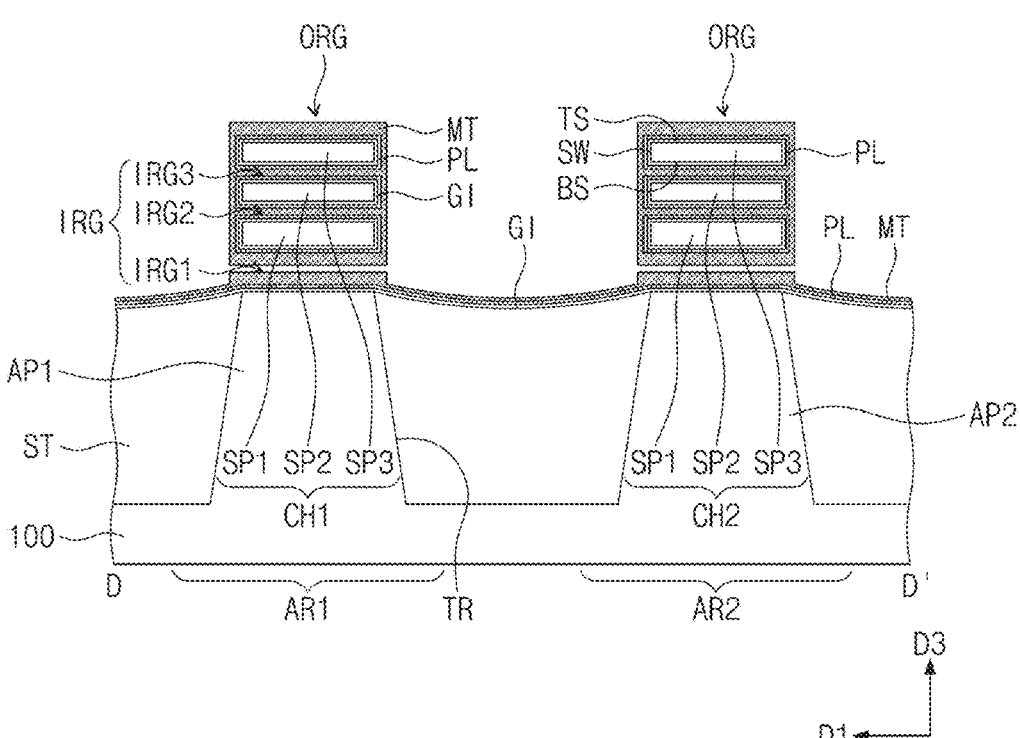
Figure 29:
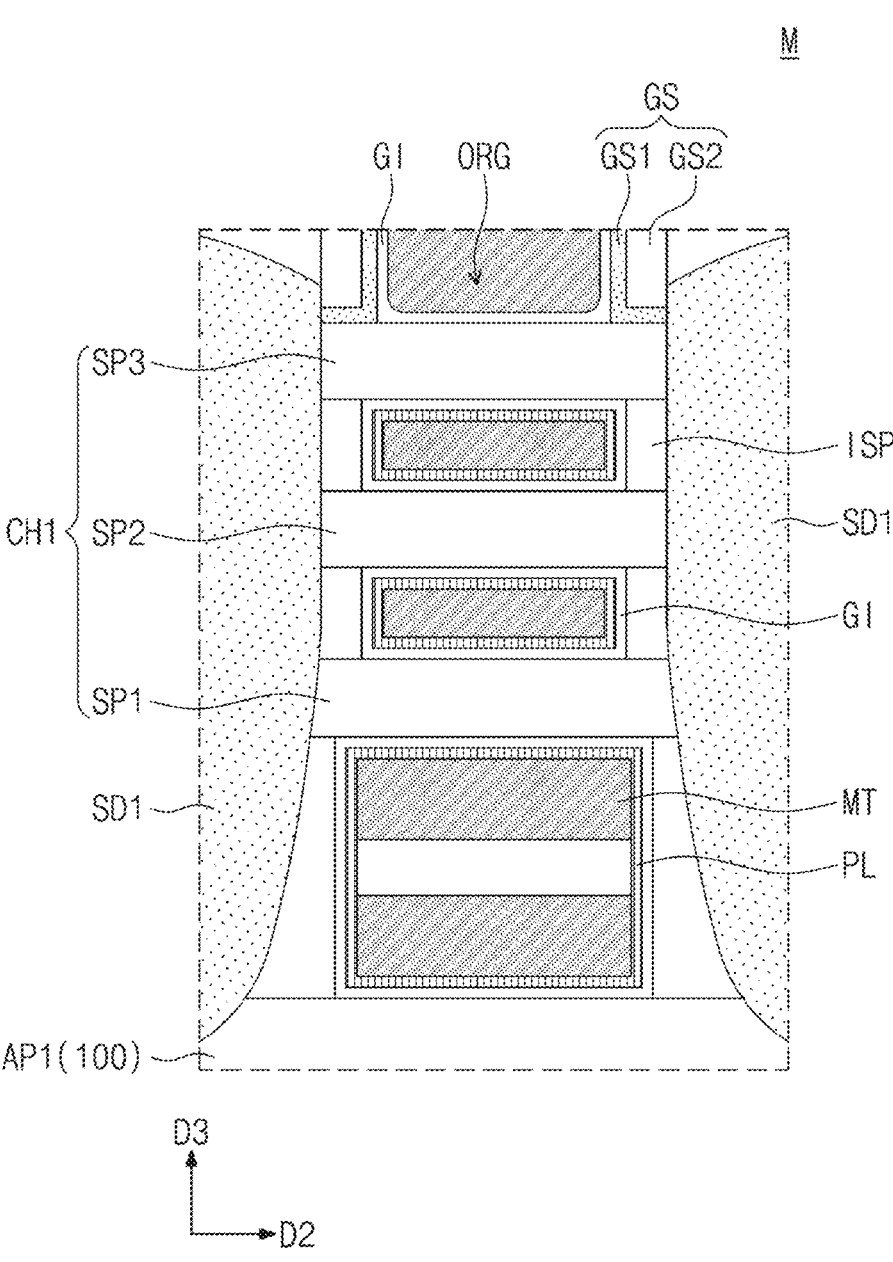

Referring to FIGS. 17A, 17B, and 29, a metal layer MT may be formed on the protection layer PL. The metal layer MT may be formed in each of the first to third inner regions IRG1 to IRG3. As shown in FIG. 17B, the first inner region IRG1 may have a height greater than those of the second and third inner regions IRG2 and IRG3, and thus the metal layer MT may not completely fill the first inner region IRG1. The metal layer MT may be formed in the outer region ORG.

The metal layer MT may include metal or dielectric. For example, the metal layer MT may include at least one selected from titanium nitride (TiN), tantalum nitride (TaN), tungsten nitride (WN), nickel nitride (NiN), cobalt nitride (CoN), and platinum nitride (PtN).

Figure 18:
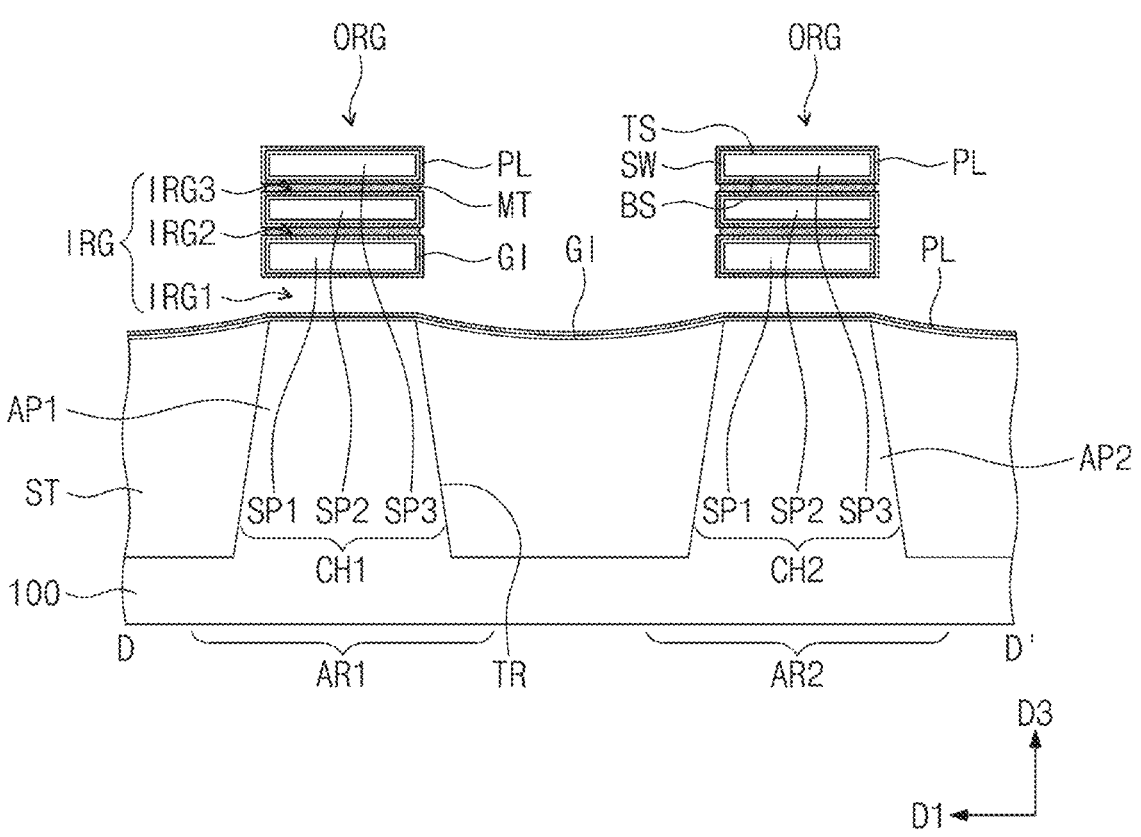

Referring to FIG. 18, the metal layer MT exposed through the outer region ORG may be selectively removed. For example, an etching process may be performed such that the metal layer MT is selectively etched to remove only the metal layer MT in the first inner region IRG1 while leaving the metal layer MT in the second and third inner regions IRG2 and IRG3.

Figure 19A:
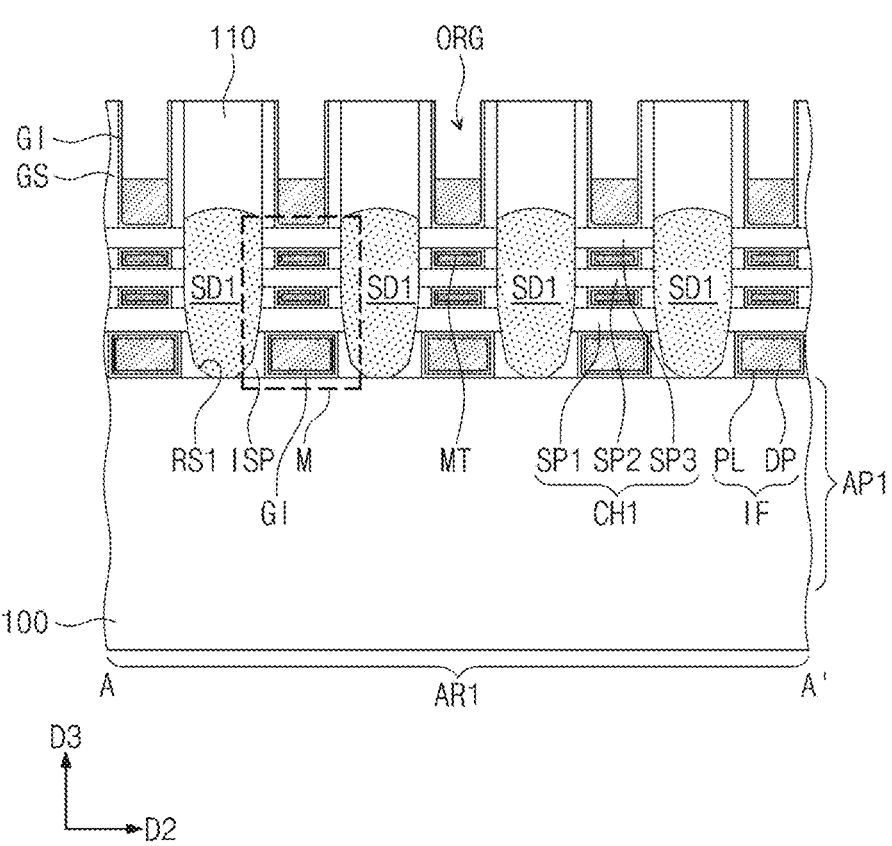
Figure 19B:
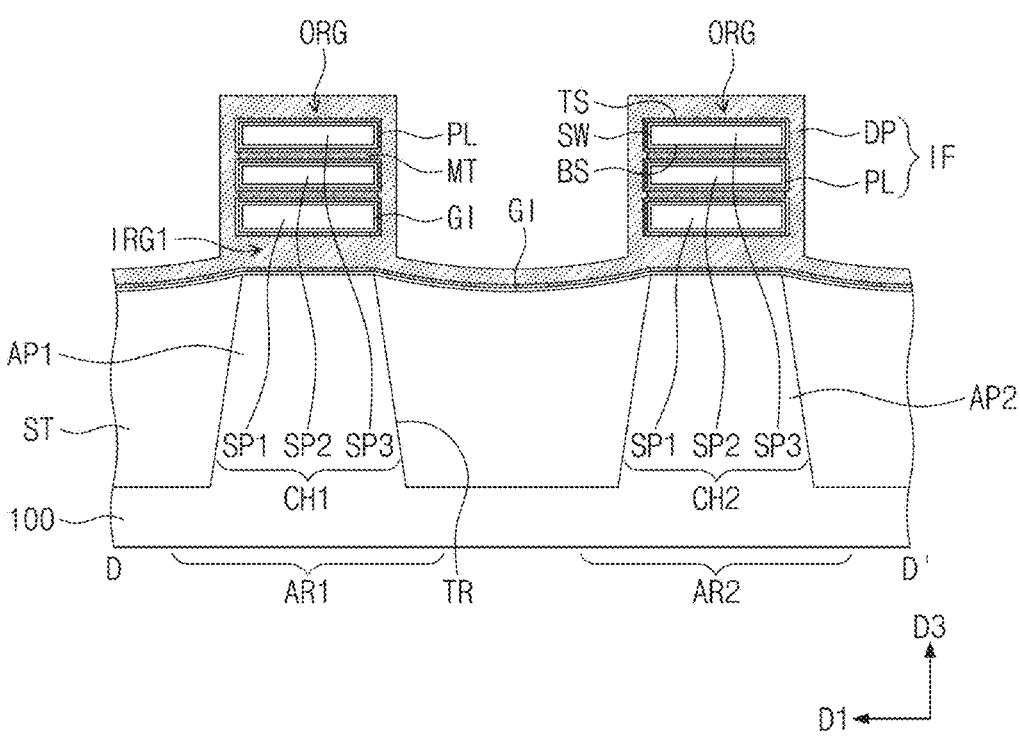
Figure 19C:
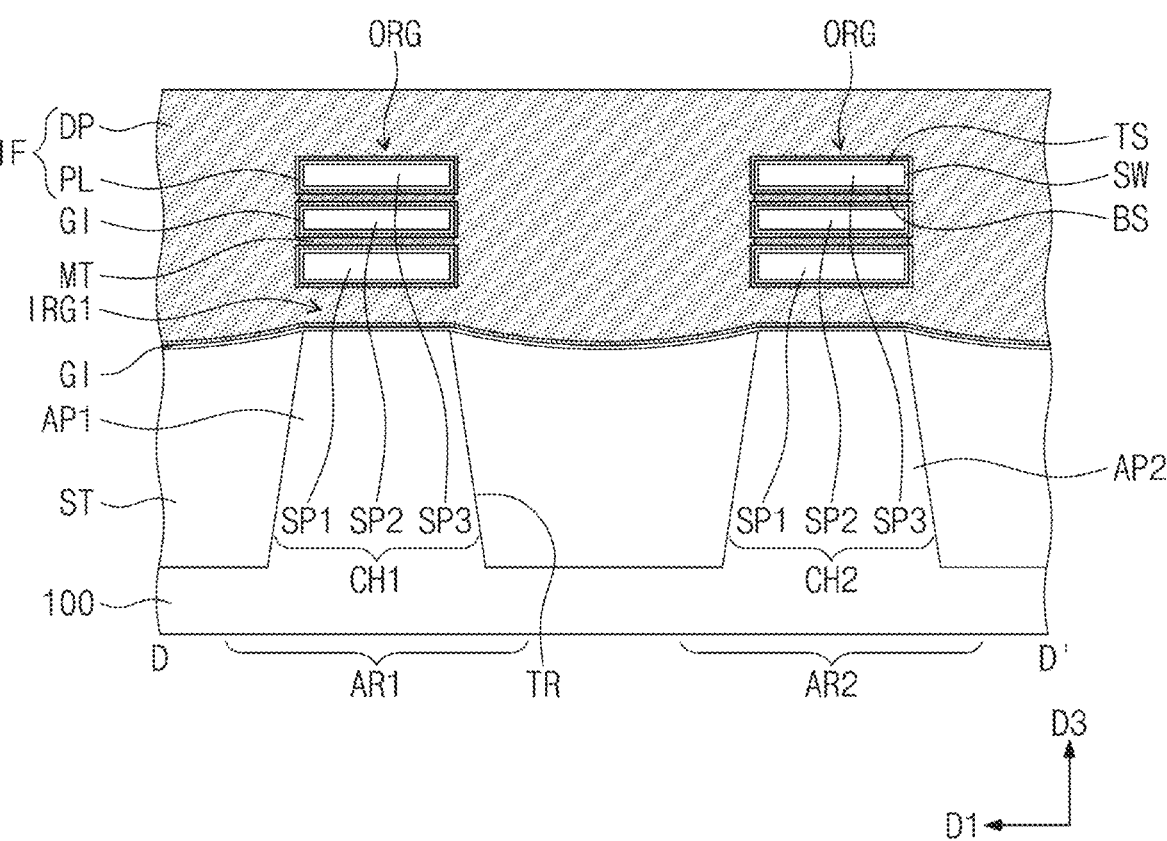
Figure 30:
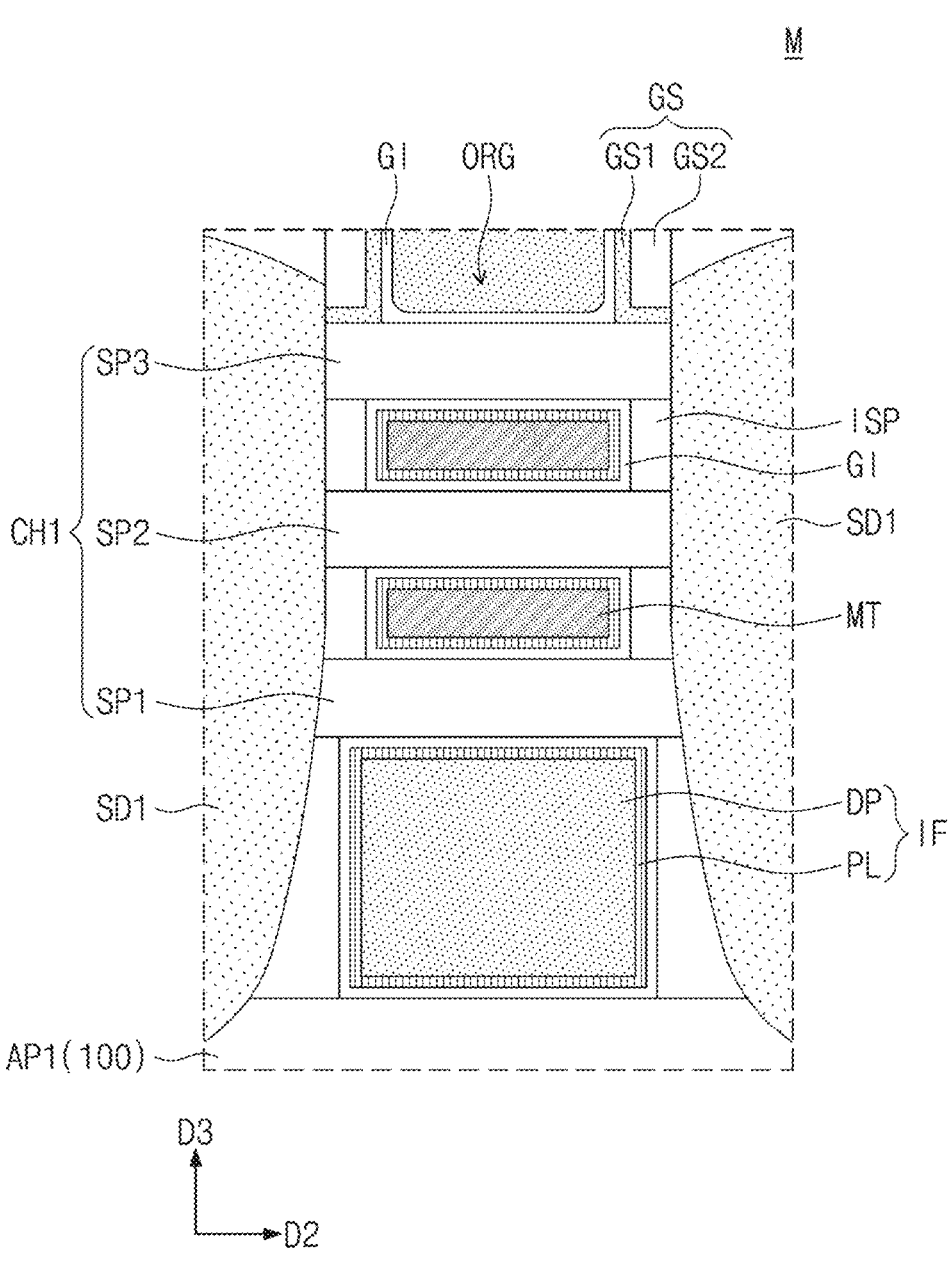

Referring to FIGS. 19A, 19B, and 30, a dielectric pattern DP may be formed on the first to third semiconductor patterns SP1 to SP3 and the metal layer MT. As shown in FIG. 19C, the dielectric pattern DP may completely fill the first inner region IRG1. The dielectric pattern DP may be formed in the outer region ORG.

Figure 20:
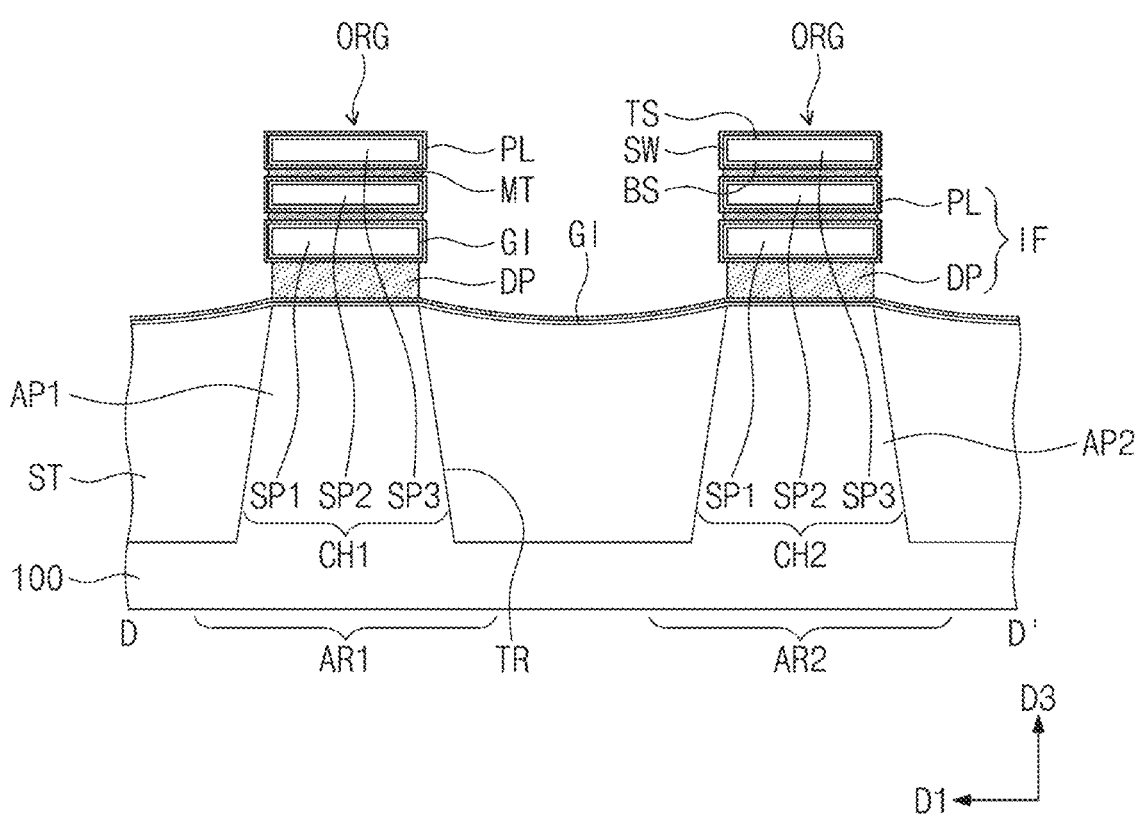

The dielectric pattern DP exposed through the outer region ORG may be selectively removed (see FIG. 20). For example, an etching process may be performed such that the dielectric pattern DP is selectively etched to remove the dielectric pattern DP while leaving only the dielectric pattern DP in the first inner region IRG1. The dielectric pattern DP may be formed in the first inner region IRG1 wherein the metal layer MT is removed.

Figure 21A:
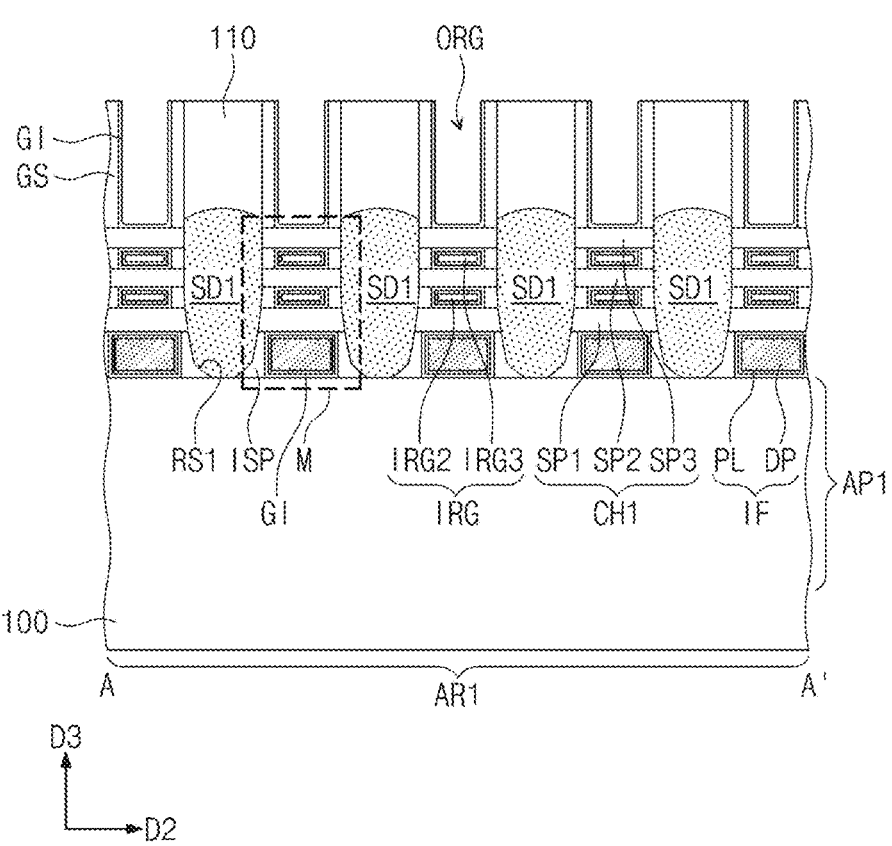
Figure 21B:
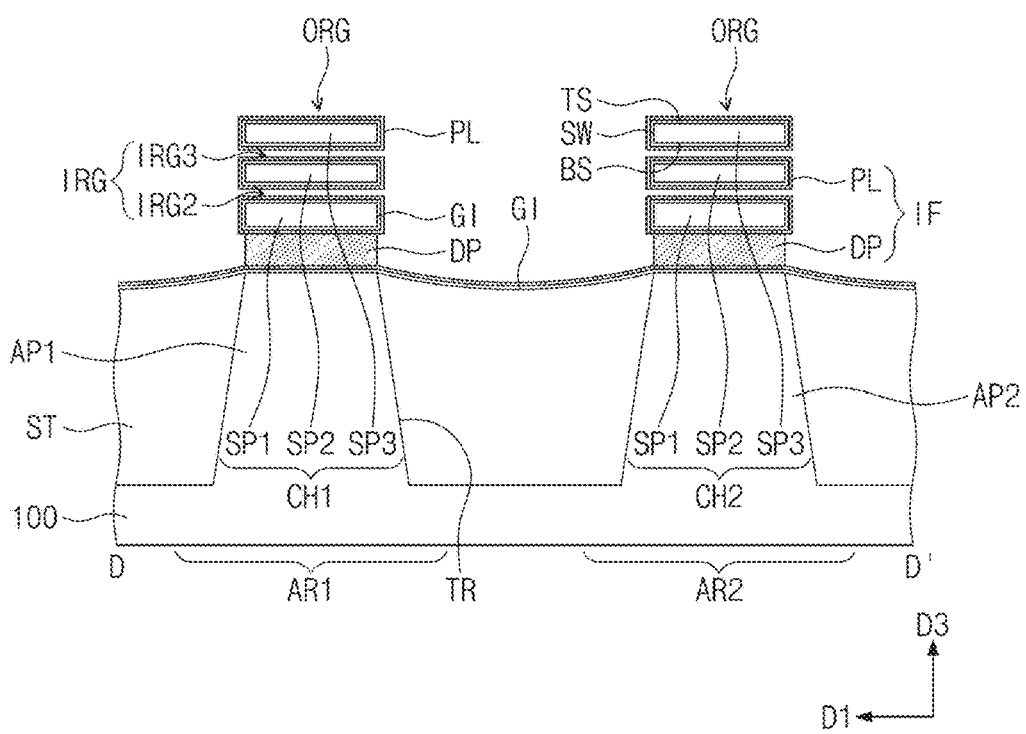
Figure 31:
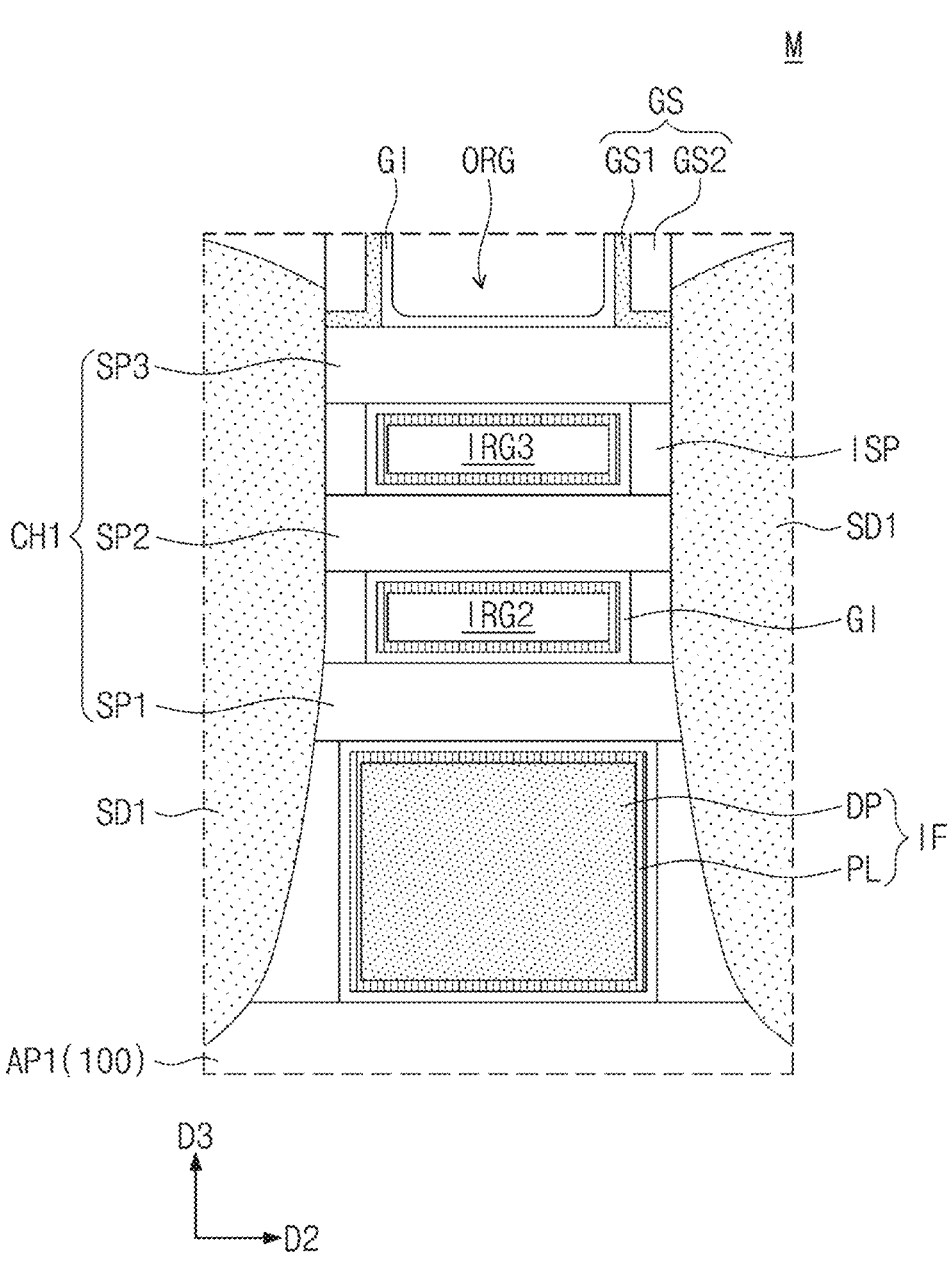

Referring to FIGS. 21A, 21B, and 31, the metal layer MT exposed through the outer region ORG may be selectively removed. An etching process may be performed such that the dielectric pattern DP is selectively etched to remove the metal layer MT in the second and third inner regions IRG2 and IRG3. In the etching process, the metal layer MT may have an etch rate greater than that of the dielectric pattern DP.

Figure 22A:
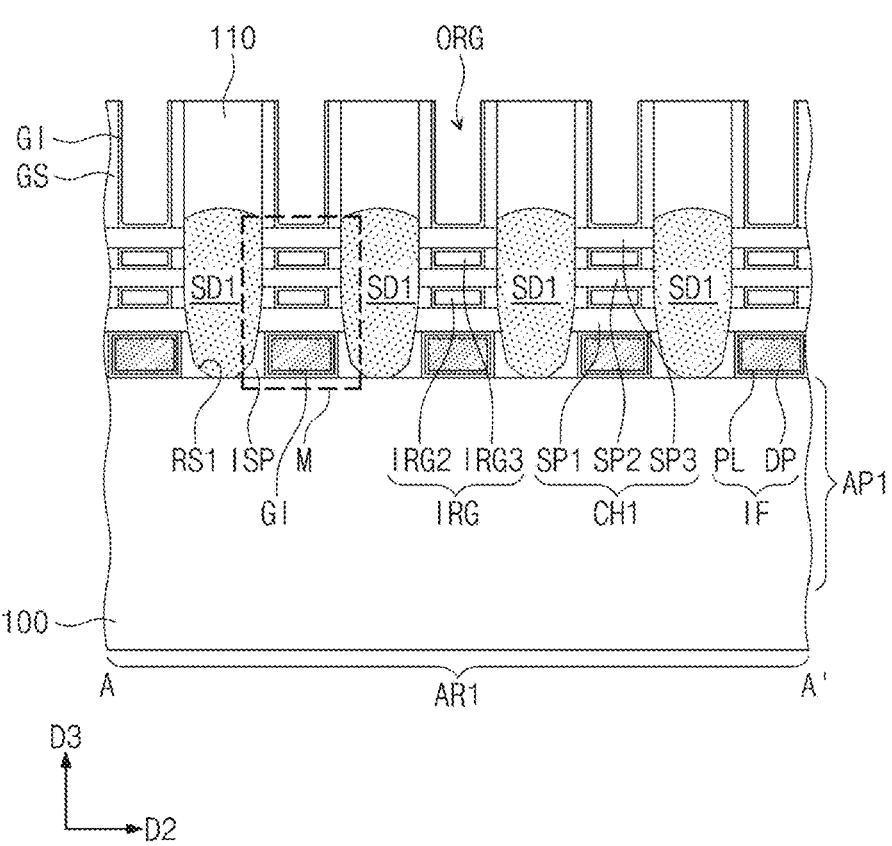
Figure 22B:
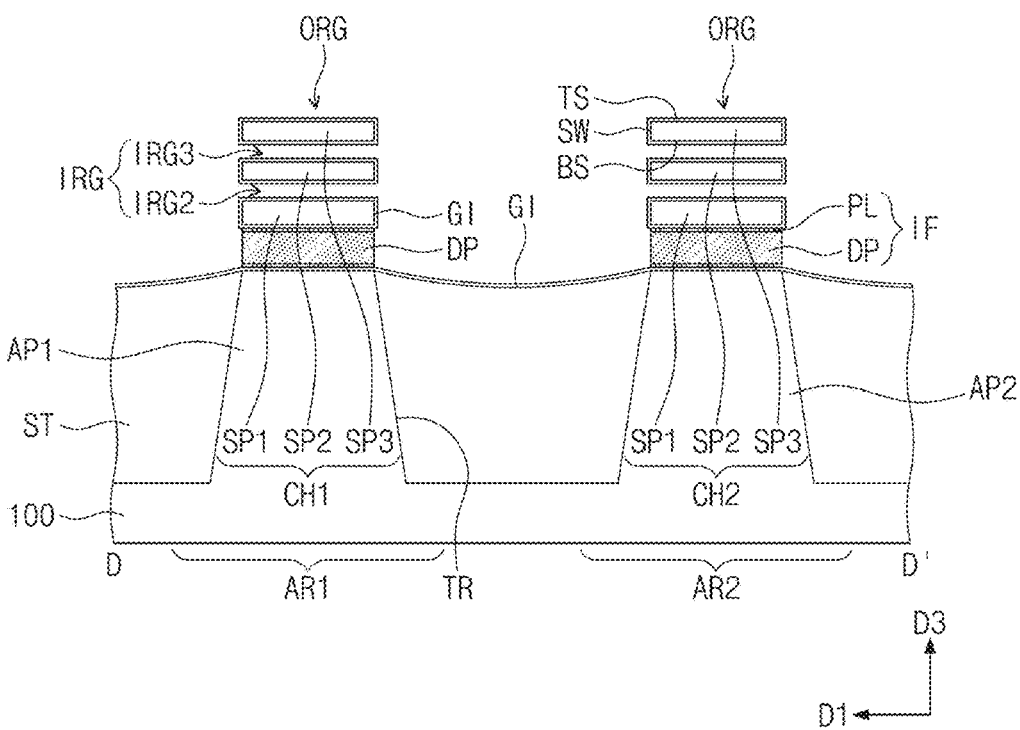
Figure 32:
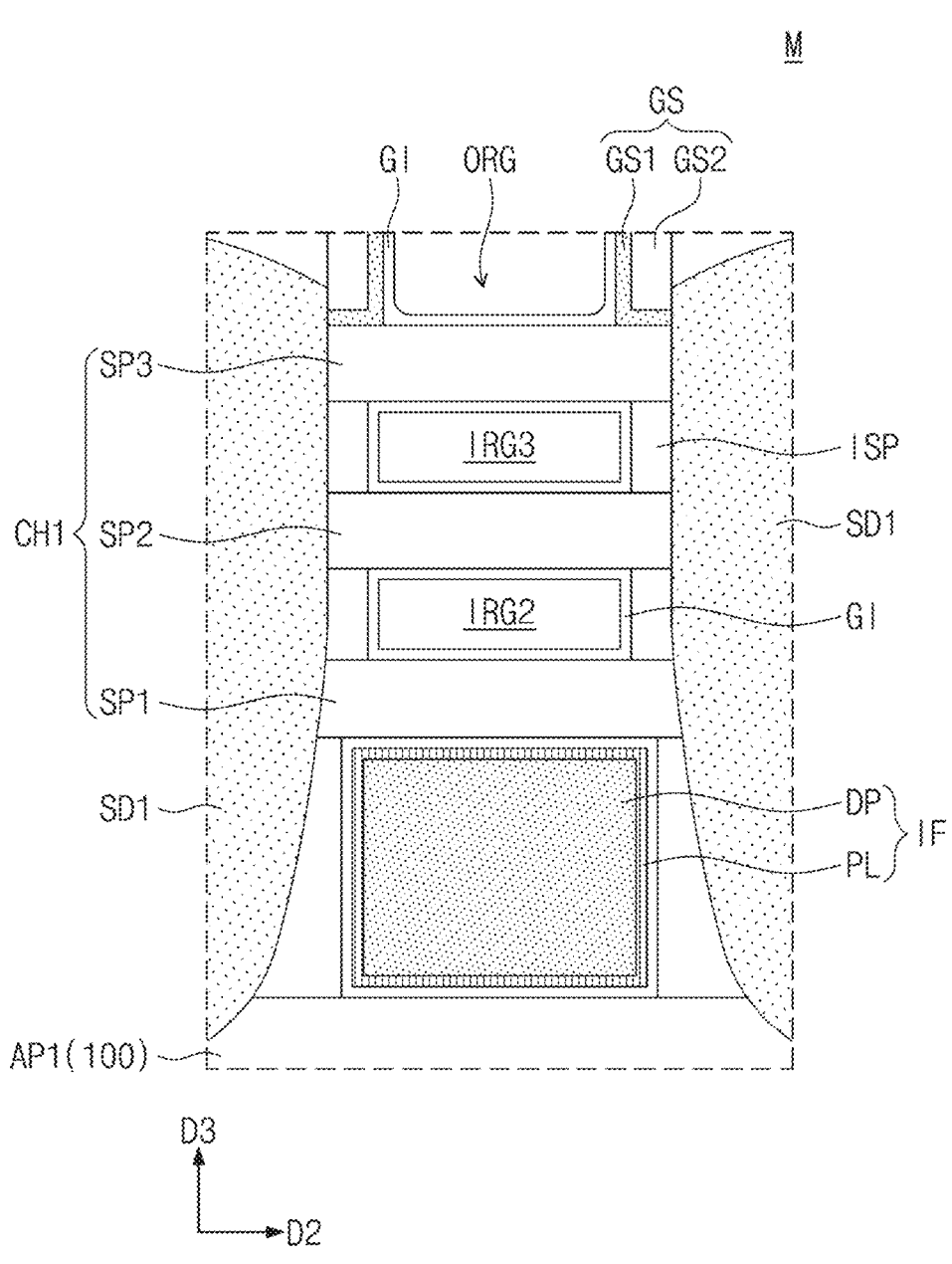

Referring to FIGS. 22A, 22B, and 32, the protection layer MT exposed through the outer region ORG may be selectively removed. An etching process may allow the protection layer PL to remain only between the dielectric pattern DP and the first semiconductor pattern SP1 and between the dielectric pattern DP and each of the first and second active patterns AP1 and AP2 (see FIG. 22B). The protection layer PL that surrounds the second and third inner regions IRG2 and IRG3 may be removed.

Figure 23A:
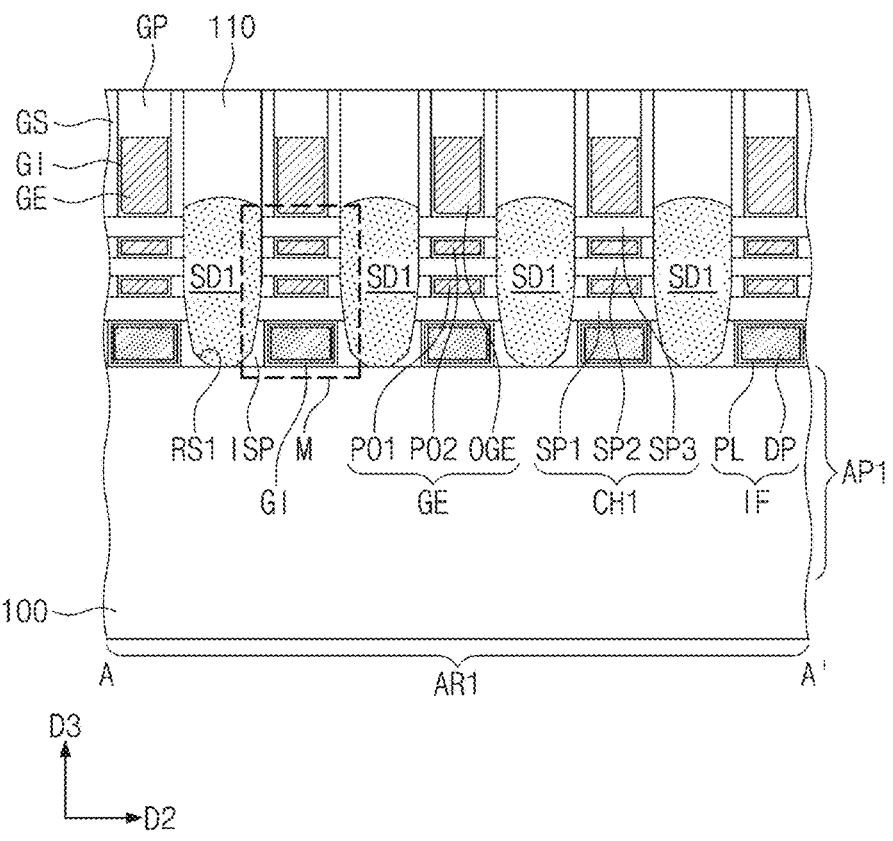
Figure 23B:
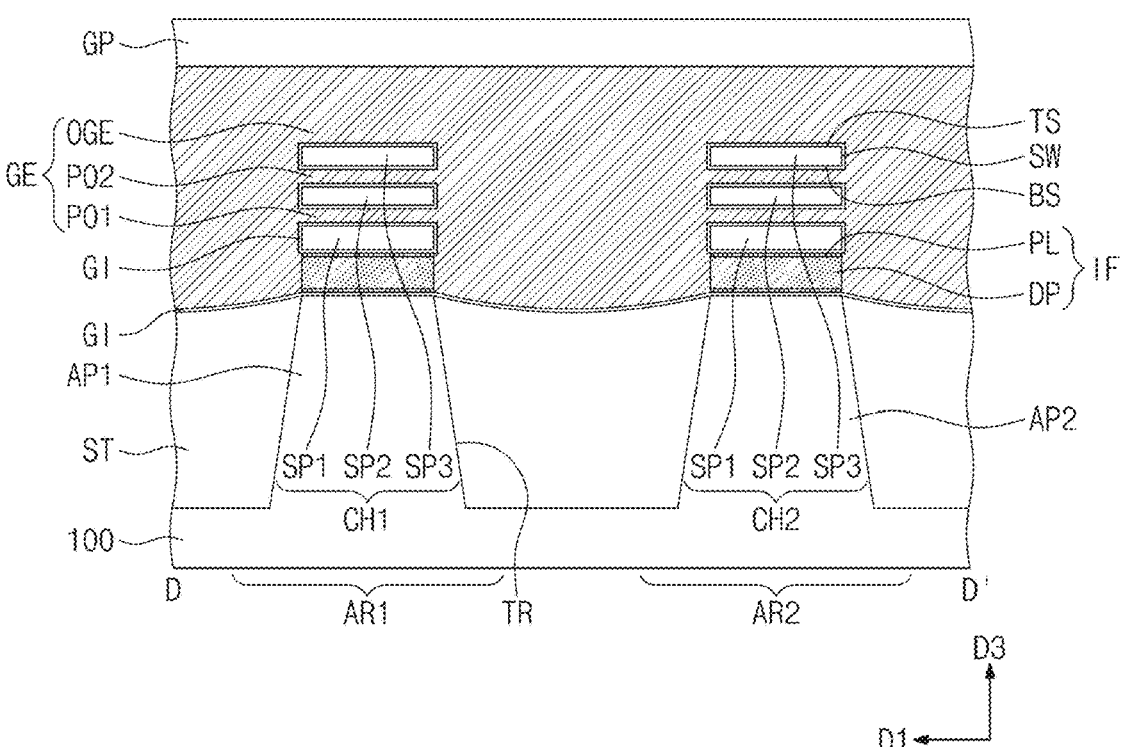
Figure 24:
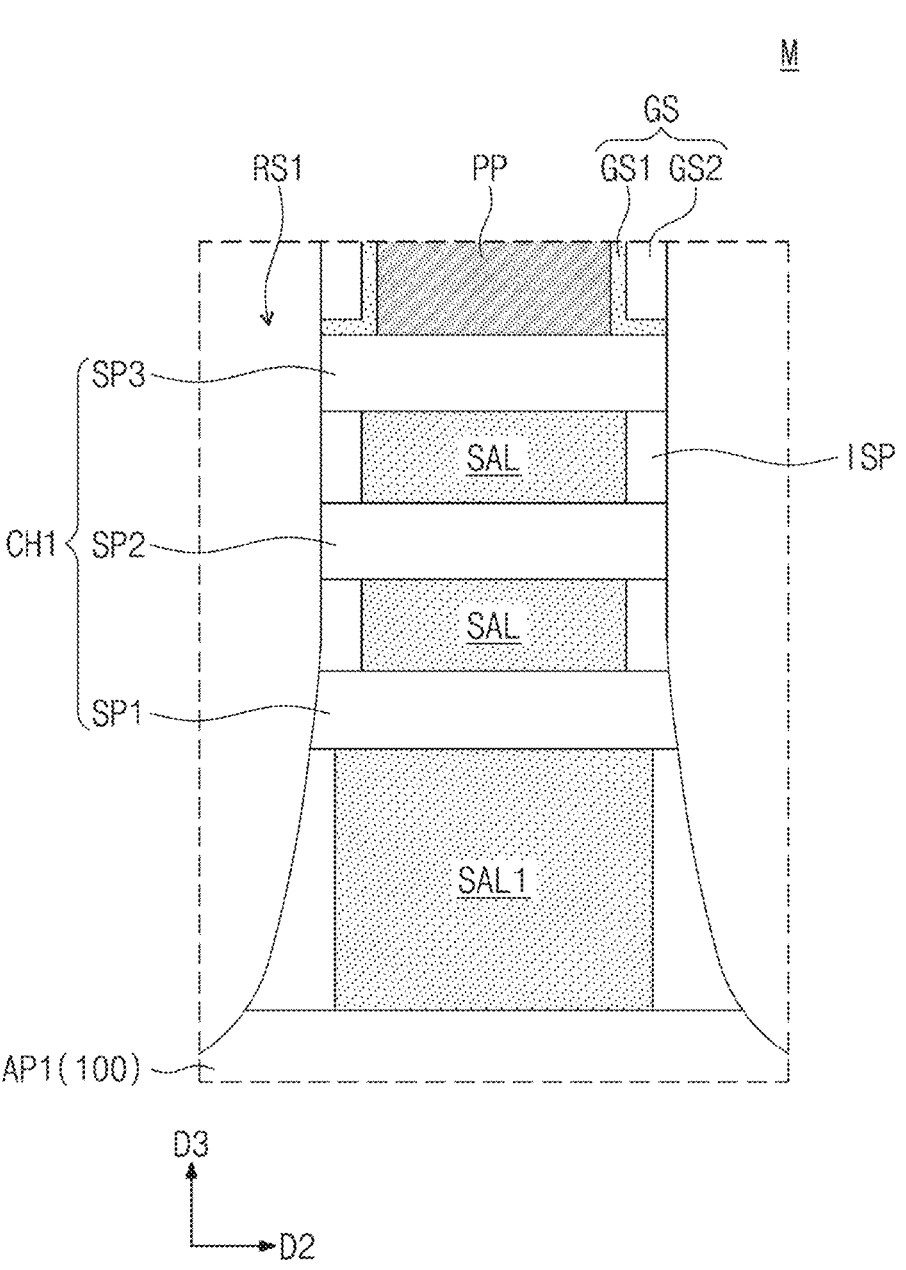
FIGS. 24 and 26 to 33 illustrate enlarged views showing an example of section M depicted in FIGS. 13A to 23A.

Referring to FIGS. 23A, 23B, and 33, a gate electrode GE may be formed on the gate dielectric layer GI. For example, the gate electrode GE may include first and second inner electrodes PO1 and PO2 that are respectively formed in the second and third inner regions IRG2 and IRG3. The gate electrode GE may include an outer electrode OGE formed in the outer region ORG.

Referring back to FIGS. 5A to 5D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 to come into electrical connection with the first and second source/drain patterns SD1 and SD2. A gate contact GC may be formed to penetrate the second interlayer dielectric layer 120 and the gate capping pattern GP to come into electrical connection with the gate electrode GE.

The formation of each of the active contact AC and the gate contact GC may include forming a barrier pattern BM and forming a conductive pattern FM on the barrier pattern BM. The barrier pattern BM may be conformally formed to include a metal layer and a metal nitride layer. The conductive patterns FM may include metal whose resistance is low.

Separation structures DB may be correspondingly formed on first and second boundaries BD1 and BD2 of the single height cell SHC. The separation structure DB may extend from the second interlayer dielectric layer 120 through the gate electrode GE into the active pattern AP1 or AP2. The separation structure DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

In a three-dimensional field effect transistor according to inventive concepts, a dielectric pattern may be disposed between a lowermost semiconductor pattern and an active pattern to limit and/or prevent the occurrence of leakage current. As a result, inventive concepts may improve reliability and electrical properties of a semiconductor device.

Although some embodiments of inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects.

What is claimed is:

1. A semiconductor device, comprising:
a substrate including an active pattern;
a channel pattern on the active pattern,
    the channel pattern including a plurality of semiconductor patterns that are spaced apart from each other and vertically stacked, and
    a lowermost one of the plurality of semiconductor patterns being a first semiconductor pattern;
a source/drain pattern connected to the plurality of semiconductor patterns;
a gate electrode on the plurality of semiconductor patterns,
    the gate electrode including a plurality of inner electrodes below the plurality of semiconductor patterns except the first semiconductor pattern; and
an insulation pattern between the first semiconductor pattern and the active pattern, wherein
the insulation pattern includes a dielectric pattern and a protection layer,
the protection layer is between the dielectric pattern and the first semiconductor pattern, and
the protection layer is between the dielectric pattern and the active pattern.

2. The semiconductor device of claim 1, wherein a thickness of the insulation pattern is greater than a thickness of each of the plurality of inner electrodes.

3. The semiconductor device of claim 1, wherein a thickness of the insulation pattern is less than a thickness of each of the plurality of inner electrodes.

4. The semiconductor device of claim 1, wherein a thickness of the insulation pattern is in a range of 6 nm to 13 nm.

5. The semiconductor device of claim 1, further comprising:
    a gate dielectric layer that surrounds each of the plurality of inner electrodes.

6. The semiconductor device of claim 5, wherein the gate dielectric layer covers a lateral surface of the insulation pattern.

7. The semiconductor device of claim 1, wherein the protection layer includes aluminum oxide (AlO).

8. The semiconductor device of claim 1, wherein a thickness of the protection layer is less than a thickness of the insulation pattern except the protection layer.

9. The semiconductor device of claim 3, wherein the protection layer surrounds the insulation pattern.

10. A semiconductor device, comprising:
a substrate including an active region;
a device isolation layer on the active region, the device isolation layer defining an active pattern on the active region;
a channel pattern on the active pattern,
    the channel pattern including a plurality of semiconductor patterns that are spaced apart from each other and vertically stacked,
    a lowermost one of the plurality of semiconductor patterns being a first semiconductor pattern;
a source/drain pattern connected to the plurality of semiconductor patterns;
a gate electrode on the plurality of semiconductor patterns,
    the gate electrode including a plurality of inner electrodes below the plurality of semiconductor patterns except the first semiconductor pattern; and
an insulation pattern between the first semiconductor pattern and the active pattern, wherein
the insulation pattern extends onto the device isolation layer between the first semiconductor pattern and the active pattern.

11. The semiconductor device of claim 10, wherein
the insulation pattern includes a dielectric pattern and a protection layer,
the protection layer is between the dielectric pattern and the first semiconductor pattern, and
the protection layer is between the dielectric pattern and the active pattern.

12. The semiconductor device of claim 10, wherein a thickness of the insulation pattern is greater than a thickness of each of the plurality of inner electrodes.

13. The semiconductor device of claim 10, wherein a thickness of the insulation pattern is less than a thickness of each of the plurality of inner electrodes.

14. The semiconductor device of claim 10, wherein a thickness of the insulation pattern is in a range of 6 nm to 13 nm.

15. The semiconductor device of claim 10, further comprising:
    a gate dielectric layer that surrounds each of the plurality of inner electrodes,
    wherein the gate dielectric layer surrounds the insulation pattern.

16. A semiconductor device, comprising:
a substrate that includes an active pattern;
a channel pattern on the active pattern,
the channel pattern including a plurality of semiconductor patterns that are spaced apart from each other and vertically stacked, a lowermost one of the plurality of semiconductor patterns being a first semiconductor pattern;
a source/drain pattern connected to the plurality of semiconductor patterns;
a gate electrode on the plurality of semiconductor patterns,
    the gate electrode including a plurality of inner electrodes below the plurality of semiconductor patterns except the first semiconductor pattern; and
an insulation pattern between the first semiconductor pattern and the active pattern, wherein
the insulation pattern includes a dielectric pattern and a protection layer, the protection layer is between the dielectric pattern and the first semiconductor pattern, the protection layer is between the dielectric pattern and the active pattern, the gate electrode extends in a first direction, the protection layer has a first width in the first direction, the dielectric pattern has a second width in the first direction, and the first width is different from the second width.

17. The semiconductor device of claim 16, wherein a thickness of the insulation pattern is greater than a thickness of each of the plurality of inner electrodes.

18. The semiconductor device of claim 16, wherein a thickness of the insulation pattern is less than a thickness of each of the plurality of inner electrodes.

19. The semiconductor device of claim 16, wherein a thickness of the insulation pattern is in a range of 6 nm to 13 nm.

20. The semiconductor device of claim 19, further comprising:

a gate dielectric layer that surrounds each of the plurality of inner electrodes, wherein the gate dielectric layer surrounds the insulation pattern.

* * * * *